United States Patent
Lee et al.

(10) Patent No.: US 7,119,013 B2
(45) Date of Patent: Oct. 10, 2006

(54) METHOD FOR FABRICATING SEMICONDUCTOR DEVICE WITH FINE PATTERNS

(75) Inventors: Min-Suk Lee, Ichon-shi (KR); Tae-Woo Jung, Ichon-shi (KR); Sung-Kwon Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 239 days.

(21) Appl. No.: 10/925,856

(22) Filed: Aug. 24, 2004

(65) Prior Publication Data
US 2005/0090055 A1 Apr. 28, 2005

(30) Foreign Application Priority Data
Oct. 23, 2003 (KR) .................. 10-2003-0074178
Dec. 22, 2003 (KR) .................. 10-2003-0094506

(51) Int. Cl.
*H01L 21/28* (2006.01)
(52) U.S. Cl. .................. 438/666; 438/672; 438/700; 438/952; 257/E21.577
(58) Field of Classification Search ........... 438/666, 438/672, 700, 952, FOR. 355; 257/E23.145, 257/E21.577
See application file for complete search history.

(56) References Cited

U.S. PATENT DOCUMENTS

| | | | |
|---|---|---|---|
| 6,479,380 B1 | 11/2002 | Furusawa et al. | |
| 6,524,964 B1 | 2/2003 | Yu | |
| 6,867,145 B1* | 3/2005 | Lee et al. | 438/706 |
| 2002/0005542 A1* | 1/2002 | Hayano et al. | 257/306 |
| 2003/0003714 A1* | 1/2003 | Lee et al. | 438/636 |
| 2003/0003756 A1* | 1/2003 | Yu | 438/706 |
| 2003/0114012 A1* | 6/2003 | Lee et al. | 438/710 |
| 2003/0181054 A1* | 9/2003 | Lee et al. | 438/709 |
| 2004/0009656 A1* | 1/2004 | Lee et al. | 438/624 |
| 2004/0126951 A1* | 7/2004 | Lee | 438/200 |
| 2004/0127024 A1* | 7/2004 | Lee | 438/672 |
| 2005/0064727 A1* | 3/2005 | Lee et al. | 438/781 |
| 2006/0073699 A1* | 4/2006 | Lee et al. | 438/639 |

FOREIGN PATENT DOCUMENTS

KR 2004-75638 8/2004

* cited by examiner

*Primary Examiner*—George Fourson
(74) *Attorney, Agent, or Firm*—Blakely Sokoloff Taylor & Zafman

(57) ABSTRACT

A method for fabricating a semiconductor device capable of preventing a hard mask from being lifted and patterns from being defective. Particularly, an inter-layer insulation layer and an etch stop layer formed on a substrate structure provided with conductive structures are first planarized. Then, a hard mask made of a nitride-based material is formed by using a photoresist pattern and an anti-reflective coating layer as an etch mask. After the hard mask formation, the photoresist pattern and the anti-reflective coating layer are removed. Subsequently, a SAC etching process is performed to etch the inter-layer insulation layer with use of the hard mask as an etch mask, thereby obtaining a contact hole exposing the etch stop layer disposed between the conductive structures. The exposed etch stop layer is removed through the use of a blanket etch-back process, and a cleaning process is applied thereafter.

34 Claims, 21 Drawing Sheets

METHOD FOR FABRICATING SEMICONDUCTOR DEVICE WITH FINE PATTERNS

FIELD OF THE INVENTION

The present invention relates to a method for fabricating a semiconductor device; and, more particularly, to a method for forming a fine pattern in a semiconductor device.

DESCRIPTION OF RELATED ARTS

Typically, a semiconductor device is formed with a number of unit device elements. As semiconductor devices have become highly integrated, sizes of unit device elements such as transistors and capacitors have proportionally decreased. Particularly, in a dynamic random access memory (DRAM) device, decrease in a design rule has led to decrease in sizes of semiconductor devices formed in cells. For instance, a linewidth of a current DRAM device is formed in a size less than 0.1 µm, and more extremely, the required down-size of the linewidth is less than 80 nm. Therefore, there are numerous difficulties to advance the development of a DRAM device with the required size of the linewidth.

If a photolithography process using a light source of ArF having a wavelength of 193 nm is applied in a semiconductor device having a linewidth less than 80 nm, it is additionally necessary to suppress a photoresist from being deformed during an etching process performed with a goal of providing a precisely shaped pattern and a vertical etch profile. Therefore, a current focus of semiconductor technology is to develop a process recipe of the etching process that satisfies both the requirements for achieving the above described goal and for suppressing pattern deformation.

Meanwhile, acceleration in the scale of integration in a semiconductor device brings out a need to form various device elements of the semiconductor device in stacks. One example of a stack structure is a contact plug.

For forming such a contact plug, a landing plug contact (LPC) is commonly formed since the LPC has a bottom portion which makes a wide contact within a minimum area and a top portion which is wider than the bottom portion to increase a contact margin. Hereinafter, a method for forming such a landing plug contact will be described in detail.

FIGS. 1A to 1D are cross-sectional views illustrating a first conventional method for forming a landing plug contact in a semiconductor device.

Referring to FIG. 1A, a plurality of gate structures G1 and G2 are formed on a substrate 10 provided with various device elements. Each of the gate structures G1 and G1 includes a gate hard mask 13, a gate conductive layer 12 and a gate insulation layer 11.

Herein, the gate insulation layer 11 is made of a typical oxide-based material such as silicon oxide, and the gate conductive layer 12 is made of a material such as polysilicon, tungsten (W), tungsten nitride (WN), tungsten silicide (WSi$_x$), or combination thereof. The gate hard mask 13 serves a role in protecting the gate conductive layer 12 in the course of forming a contact hole by etching an inter-layer insulation layer, and thus, the gate hard mask is made of a material providing a highly different etch selectivity from the inter-layer insulation layer. For instance, if the inter-layer insulation layer is made of an oxide-based material, the gate hard mask 13 is made of a nitride-based material such as silicon nitride (SiN) or silicon oxynitride (SiON). If the inter-layer insulation layer is made of a polymer-based low dielectric material, the gate hard mask 13 is made of an oxide-based material.

An impurity diffusion region 14 such as a source/drain junction is formed in the substrate 10 disposed between the gate structures G1 and G2. In general, if the source/drain junction is formed by performing an ion implantation method, impurities are ion implanted by the ion implantation method proceeding in alignment with the substrate 10. Then, a spacer is formed on sidewalls of each gate structure G1 and G2, and then, an ion implantation method is performed again to make a lightly doped drain (LDD) structure. Herein, detailed description of the steps for forming the LDD structure and the spacer is omitted.

Next, an etch stop layer 15 is formed on the gate structures G1 and G2. Herein, the etch stop layer 15 serves a role in stopping a self-aligned contact (SAC) etching process in order to protect the substrate 10 from being damaged by the SAC etching process. At this time, it is preferable that the etch stop layer 15 is formed along a profile of the gate structures G1 and G2 and is made of a nitride-based material.

Referring to FIG. 1B, an inter-layer insulation layer 16 made of an oxide-based material is formed on the etch stop layer 15. Examples of the oxide-based material for forming the inter-layer insulation layer 16 are borophosphosilicate glass (BPSG), borosilicate glass (BSG), phosphosilicate glass (PSG), tetraethylorthosilicate (TEOS), high density plasma (HDP) oxide and spin on glass. It is still possible to use inorganic or organic low dielectric materials for forming the inter-layer insulation layer 16.

Afterwards, a photoresist pattern 17 for forming a landing plug contact (LPC) is formed on the inter-layer insulation layer 16. Although not illustrated, it is possible to form an anti-reflective coating layer between the inter-layer insulation layer 16 and the photoresist pattern 17.

Referring to FIG. 1C, the inter-layer insulation layer 16 and the etch stop layer 15 are etched by using the photoresist pattern 17 as an etch mask to thereby form a contact hole 18 exposing the impurity diffusion region 14 between the gate structures G1 and G2.

At this time, the inter-layer insulation layer 16 is etched by performing a SAC etching process adopted under using a different etch selectivity between the inter-layer insulation layer 16 and the gate hard mask 13. This SAC etching process stops at the etch stop layer 15. The etch stop layer 15 is then removed to expose the impurity diffusion region 14. Afterwards, a cleaning process is performed to extend an opening of the contact hole 18 and to remove etch remnants. In the SAC etching process, a mixed gas, obtained by mixing a gas of $C_xF_y$, where x and y representing atomic ratios range from 1 to 10, and a gas of $C_aH_bF_c$, where a, b and c representing atomic ratios range from 1 to 10, are used as an etch gas. Examples of $C_xF_y$ gas and $C_aH_bF_c$ are $CF_4$ and $CH_2F_2$, respectively.

Meanwhile, as the scale of integration in a semiconductor device increases, heights of the gate structures G1 and G2 proportionally increase, further resulting in an increase in a thickness of an etch target of the SAC etching process. As a result, it is necessary to overuse an etch gas and elongate an etching period. This over-etching causes the gate hard mask 13 to be damaged as denoted with a reference numeral 19 in FIG. 1C.

Subsequently, the photoresist pattern 17 is removed through an ashing process. If the anti-reflective coating layer is made of an organic-based material, the anti-reflective coating layer is removed by this ashing process.

Referring to FIG. 1D, a conductive material for forming a plug is filled into the contact hole 18 and is subsequently planarized until the gate hard mask 13 is exposed. From this planarization process, a plug 20 is formed. At this time, the plug 20 is electrically connected with the impurity diffusion region 14 through the contact hole 18 and is planarized at the same level as the gate hard mask 13. Polysilicon is the most commonly used conductive material for forming the plug 20, and such a barrier metal of Ti and TiN can be used as the conductive material along with polysilicon. Instead of polysilicon, tungsten can be used as the conductive material.

Because of the damage 19 to the gate hard mask 13 during the SAC etching process, an insulating property between the plug 20 and the gate conductive layer 12 becomes deteriorated. If the gate conductive layer 12 is exposed by the severe damage to the gate hard mask 13, the plug 20 and the gate conductive layer 12 becomes electrically shorted. This electric short phenomenon is expressed as a reference denotation 'X' in FIG. 1D.

As shown above, as the scale of integration advances, the gate hard mask 13 is damaged in the course of forming the landing plug contact. Also, a thickness of the photoresist pattern needs to be reduced in order to obtain an intended resultant with high resolution, and as a result, the photoresist pattern with the decreased thickness cannot function properly as a mask during the etching process.

For these reasons, a hard mask is additionally formed between the photoresist pattern and an etch target layer, or between the anti-reflective coating layer and the etch target layer. This approach is widely used in photolithography using a KrF or ArF photolithography device. Currently employed materials for the hard mask are tungsten and polysilicon. For an ArF photoresist, polymers such as cyclic olefin maleic anhydride (COMA), acrylate and the combination thereof are generally used. Although the ArF photolithography process can be advantageous in achieving an effect of micronization, there still exist many difficulties compared with the KrF photolithography process.

FIG. 2 is a micrograph of scanning electron microscopy (SEM) depicting a deformed ArF photoresist pattern.

As shown, in a landing plug contact formation process with use of the ArF photolithography process, the ArF photoresist pattern becomes striated during an etching process for forming target patterns. This striation expressed as a reference denotation 'A' is caused by a characteristic of the ArF photoresist. More specifically, the ArF photoresist has a weak tolerance to the etching process using a fluorine-based gas.

FIG. 3 is a micrograph of SEM showing a gate hard mask damaged during a landing plug contact formation process employing an ArF photolithography process.

As shown, after a SAC etching process for forming a landing plug contact, the gate hard mask becomes damaged as marked with a reference denotation 'B'. A thickness of the damaged portion is greater than 800 Å.

FIGS. 4A and 4B are micrographs of SEM respectively showing a pattern collapse phenomenon and defective photoresist patterns during a landing plug contact formation process employing an ArF photolithography process.

As shown in FIG. 4A, ArF photoresist patterns formed in bar type become collapsed during the landing plug contact formation process. This pattern collapse phenomenon marked with a reference denotation 'C' induces defects in devices.

As shown in FIG. 4B, ArF photoresist patterns become defective at weak points of the ArF photoresist patterns, and a reference denotation 'D' expresses these defective ArF photoresist patterns.

For the landing plug contact formation process, it is required to minimize the damage to the gate hard mask during the SAC etching process for etching the inter-layer insulation layer and to secure a sufficient contact area. However, these requirements of the landing plug contact formation process have a trade-off relationship with the requirement of the ArF photolithography process to prevent the pattern deformation. Thus, as parameters such as an electrode temperature and power vary, there is an adverse effect of reducing process margins and a difficulty in setting up a proper process recipe.

For instance, in case of employing a KrF photolithography process, the electrode temperature is preferably maintained at 60° C. during the SAC etching process for forming the landing plug contact. However, this maintained electrode temperature induces deformation of the photoresist patterns during the SAC etching process, and thus, it is necessary to maintain the electrode temperature at 0° C. In contrast, if the electrode temperature is maintained at a low temperature, there is an effect of suppressing the pattern deformation. However, this low electrode temperature results in a decrease in an etch selectivity between etch target layers made of different materials, e.g., oxide and nitride.

When the SAC etching process is performed under the same condition, compared with the case of employing the KrF photolithography process, the case of employing the ArF photolithography process makes the gate hard mask damaged with a thickness greater than 200 Å. If the thickness of the hard mask is increased in order to compensate for the loss of the gate hard mask, the height of the gate structure also increases, thereby further increasing an aspect ratio. As a result of this increased aspect ratio, it is difficult to retain a gap-fill property and secure a required contact area.

To solve the problem of the damage to the gate hard mask, the gate hard mask is covered with a capping layer in an over-hang structure. At this time, the capping layer is formed by using undoped silicate glass (USG) having a poor step coverage property. However, this use of capping layer in the conventional KrF photolithography process may result in a non-opened contact due to a difficulty in controlling a thickness of an inter-layer insulation layer made of an oxide-based material disposed inside the contact. Thus, it is necessary to skip the step of forming the capping layer in order to obtain an economically more competitive landing plug contact structure.

Even in the ArF photolithography process, because photoresist patterns are thinly formed and have a weak tolerance to the etching process, the photoresist patterns have weak points that cause defects in the photoresist patterns. Also, there is another problem in that the photoresist patterns are collapsed because of the increased aspect ratio.

In order to overcome these problems, a hard mask made of tungsten or polysilicon is formed between the photoresist pattern and the etch target layer. In case of using tungsten as the hard mask, an etch stop layer and an inter-layer insulation layer are formed on a substrate structure including gate structures. A tungsten layer and a photoresist pattern are sequentially formed on the inter-layer insulation layer, and then, the tungsten layer is etched with use of the photoresist pattern as an etch mask to form the hard mask made of tungsten. Then, the photoresist pattern is removed, and the inter-layer insulation layer and the etch stop layer are etched with use of the above hard mask as an etch mask. The hard mask is then removed, and a cleaning process is carried out thereafter. A material for forming a plug is formed on the above resulting substrate structure and is subjected to a planarization process, thereby obtaining a plug. Detailed diagrams for illustrating these described steps of forming a landing plug contact are omitted.

The use of tungsten or polysilicon as the hard mask material makes it possible to decrease the thickness of the photoresist, thereby improving sensitivity to a light emitted from a photolithography device during a photo-exposure process. Also, it is possible to solve the problems of the pattern deformation usually observed in the ArF photolithography process, the damage to the gate hard mask and the decreased contact area.

However, it is essential to remove the employed conductive material for forming the hard mask, i.e., tungsten or polysilicon. Also, in the course of performing the SAC etching process, the removal of the above mentioned conductive material for forming the hard mask and the etching of the inter-layer insulation layer proceed in different chambers, thereby resulting in an elongated processing time and contamination by particles. These problems are observed in a process like the SAC etching process for forming negative patterns and in a process for forming positive patterns such as gate structures, bit line structures, and metal wires.

Additionally, for the landing plug contact formation process, a currently employed selective epitaxial growth (SEG) method, wherein a conductive material for forming a plug is grown by using selectivity between an exposed silicon substrate and an insulation layer, cannot be applicable to the hard mask made of tungsten or polysilicon which does not have selectivity with the silicon substrate.

Therefore, nitride is used for forming the hard mask in order to solve the above problem. This use of nitride for forming the hard mask will be described in more detail hereinafter.

FIGS. 5A to 5F are cross-sectional views illustrating a second conventional method for forming a pattern in a semiconductor device by using an ArF photolithography device.

Referring to FIG. 5A, a plurality of gate structures G1 and G2 are formed on a substrate 50 provided with various device elements. Each of the gate structures G1 and G1 includes a gate hard mask 53, a gate conductive layer 52 and a gate insulation layer 51.

Herein, the gate insulation layer 51 is made of a typical oxide-based material such as silicon oxide, and the gate conductive layer 52 is made of a material such as polysilicon, W, WN, $WSi_x$, or combination thereof. The gate hard mask 53 serves a role in protecting the gate conductive layer 52 in the course of forming a contact hole by etching an inter-layer insulation layer, and thus, the gate hard mask 53 is made of a material providing a highly different etch selectivity from the inter-layer insulation layer. For instance, if the inter-layer insulation layer is made of an oxide-based material, the gate hard mask 53 is made of a nitride-based material such as SiN or SiON. If the inter-layer insulation layer is made of a polymer-based low dielectric material, the gate hard mask 53 is made of an oxide-based material.

An impurity diffusion region 54 such as a source/drain junction is formed in the substrate 50 disposed between the gate structures G1 and G2. In general, if the source/drain junction is formed in the substrate 50 disposed between the gate structures G1 and G2 through performing an ion implantation method, impurities are ion implanted by the ion implantation method proceeding in alignment with the substrate 50. Then, a spacer is formed on sidewalls of each gate structure G1 and G2, and then, an ion implantation method is performed again to make a lightly doped drain (LDD) structure. Herein, detailed description on the steps of forming the LDD structure and the spacer is omitted.

Next, an etch stop layer 55 is formed on the gate structures G1 and G2. Herein, the etch stop layer 55 serves a role in stopping a SAC etching process in order to protect the substrate 50 from being damaged by the SAC etching process. At this time, it is preferable that the etch stop layer 55 is formed along a profile of the gate structures G1 and G2 and is made of a nitride-based material such as silicon nitride or silicon oxynitride.

Referring to FIG. 5B, an inter-layer insulation layer 56 made of an oxide-based material is formed on the etch stop layer 55. Examples of the oxide-based material for forming the inter-layer insulation layer 56 are BPSG, BSG, PSG, TEOS, HDP oxide and SOG. It is still possible to use inorganic or organic low dielectric materials for forming the inter-layer insulation layer 56.

Next, a nitride layer 57 for forming a hard mask is formed on the inter-layer insulation layer 56. Herein, the nitride layer has an insulating property and a different etch selectivity from the inter-layer insulation layer 56. Also, the nitride layer 57 is formed by preferably employing a plasma enhanced chemical vapor deposition (PECVD) method or a low pressure chemical vapor deposition (LPCVD) method. At this time, a thickness of the nitride layer 57 is determined under consideration of a thickness of a damaged portion of the nitride layer 57 during a SAC etching process applied to the inter-layer insulation layer 56 and a thickness of another damaged portion of the nitride layer 57 during a process for opening the impurity diffusion region 54 by etching the etch stop layer 55. That is, a thickness of the nitride layer 57 preferably is equal to or greater than such a thickness that allows the nitride layer 57 to be naturally removed in situ when the etch stop layer 55 is removed.

Afterwards, an anti-reflective coating layer 58 is formed on the nitride layer 57 for the purpose of preventing undesired patterns from being formed by scattering reflection generated by a high index of reflection of the nitride layer 57 and of improving adhesion between the nitride layer 57 and a photoresist layer which will be subsequently formed. Herein, the anti-reflective coating layer 58 is preferably made of an organic material having a similar etch characteristic to the subsequent photoresist layer. It is also possible to omit the step of forming the anti-reflective coating layer 58.

Next, a photoresist pattern 59 is formed on the anti-reflective coating layer 58. In more detail of the photoresist pattern formation, the above mentioned photoresist layer for use in an ArF photolithography process is formed on the anti-reflective coating layer 58 by using a spin coating method. Predetermined portions of the photoresist layer are selectively photo-exposed by using an ArF photolithography device and a predetermined reticle for defining a width of a contact hole. Then, photo-exposed portions or non-photo-exposed portions are made to remain by a developing process, and etch remnants are removed by a cleaning process thereafter.

If the hard mask is made of tungsten or polysilicon, an alignment key opening process is additionally necessary for a mask alignment because of a problem in detecting an over-lay caused by a high index of reflection of the tungsten or polysilicon hard mask. However, there is not a difficulty in the mask alignment since the nitride layer 57 for forming the hard mask has a lower index of reflection than the above materials such as tungsten and polysilicon.

Also, since the photoresist layer requires only a thickness that allows the thin nitride layer 57 to be etched, it is possible to eliminate the use of the hard mask made of tungsten or polysilicon, or to form the photoresist layer with a thinner thickness compared with the case of forming the photoresist pattern along with the hard mask made of polysilicon or tungsten. This decreased thickness of the photoresist layer makes it possible to form fine patterns without the collapsed patterns.

Referring to FIG. 5C, the anti-reflective coating layer 58 and the nitride layer 57 are etched with use of the photoresist pattern 59 as an etch mask to thereby form a hard mask 57A. The photoresist pattern 59 is removed through an ashing process. If the anti-reflective coating layer 58 is made of an organic-based material, the anti-reflective coating layer 58 is simultaneously removed with the photoresist pattern 59. Herein, the ashing process is a photoresist stripping process or an oxygen plasma treatment. Also, it is necessary to remove the remaining photoresist pattern 59, which may result in defective patterns.

Referring to FIG. 5D, the inter-layer insulation layer 56 is etched by using the hard mask 57A as an etch mask to thereby form a contact hole 60 exposing the etch stop layer 55 disposed between the gate structures G1 and G2. This etching process is a SAC etching process. At this time, since the SAC etching process can be performed without consideration of the pattern deformation, a process recipe that maximizes an etch selectivity of the inter-layer insulation layer 56 with respect to the hard mask 57A and secures sufficiently a critical dimension (CD) of a bottom of the contact hole 60 is employed.

Compared with the SAC etching process using a photoresist pattern as an etch mask, a thickness of the damaged hard mask 53 decreases in more extents even with the addition of the thickness of the damaged gate hard mask 53, i.e., 300 Å obtained when the etch stop layer 55 is etched. This decreased damaged portion of the gate hard mask 53 eliminates the need of forming a capping layer made of USG on the gate structures to protect the gate hard mask 53. This damaged portion of the gate hard mask 53 is marked with a reference denotation 'L' in FIG. 5D.

This elimination of the capping layer formation provides effects of achieving a simplified process and of preventing an incidence of non-opened contact usually taking place when the etch stop layer 55 is etched because of the non-uniformly formed capping layer. For instance, in a device with a minimum linewidth of 100 nm, there are frequent cases of failure in controlling the capping layer formation process. Thus, it is further required to carefully control a thickness of the capping layer and a wet cleaning process.

In a device with a linewidth less than 80 nm, it is practically impossible to apply the capping layer formation process because of a problem that the capping layer has an over-hang structure. Therefore, it is essential to omit the capping layer formation process in a device with a linewidth less than 80 nm.

Referring to FIG. 5E, the exposed etch stop layer 55 is removed by performing a blanket etch-back process which causes the impurity diffusion region 54 to be exposed. At this time, the gate hard mask 53 is damaged as much as a removed thickness of the etch stop layer 55. That is, the damaged thickness of the gate hard mask 53 is 300 Å, and thus, a totally damaged thickness of the gate hard mask 53 ranges from 600 Å to 700 Å.

Also, since the hard mask 57A is made of nitride having an insulating property, it is possible to perform a series of the landing plug contact formation processes in situ using the same equipment. For instance, in case of employing a two-chamber body equipment with a photoresist stripper, it is possible to proceed with the hard mask formation process and the subsequent photoresist stripping process in one chamber and to proceed with the SAC etching process and the etching process for removing the etch stop layer in another chamber. As a result of this effect, it is possible to solve the problem of performing the etching process for forming the tungsten or polysilicon hard mask ex situ, and thus to shorten a turn around time (TAT).

Referring to FIG. 5F, a conductive material for use in a plug is filled into the contact hole 60 and is then planarized until the gate hard mask 53 is exposed. From this planarization process, a plug 61 is formed. At this time, the plug 61 is electrically connected with the impurity diffusion region through the contact hole 60 and is planarized at the same level as the gate hard mask 53.

For the planarization process, an etch-back process is performed to the above conductive material to decrease a height difference between a cell region and a peripheral region prior to performing a chemical mechanical polishing (CMP) process. Meanwhile, the hard mask 57A can be set to remain in the peripheral region by forming the nitride layer 57 thickly in regions except for the peripheral region, or by removing the etch stop layer 55 with use of a mask opening only the cell region instead of performing the blanket etch-back process.

The reason for making the hard mask 57A remain in the peripheral region is to prevent the gate structures G1 and G2 in the peripheral region from being damaged during the subsequent CMP process. This damage to the gate structures G1 and G2 occurs as a result of a difference in density of the gate structures G1 and G2 in the cell region and in the peripheral region. By protecting the gate structures G1 and G2 with the hard mask 57A, it is possible to increase a process margin of the CMP process.

In addition, instead of performing the CMP process employed as the planarization process with the goal of exposing the gate hard mask 53, depending on a mask type, the CMP process can also proceed until a portion of the inter-layer insulation layer 53 remains. Also, polysilicon is most commonly used as the conductive material, and a barrier metal of Ti and TiN can be used as the conductive material in addition to the use of polysilicon. Also, instead of using polysilicon, tungsten can be used.

Since the hard mask 57A is made of nitride having an insulation property, it is possible to form the plug 61 made of polysilicon through a deposition method or through a selective epitaxial growth (SEG) method. In more detail of the SEG method, if the hard mask 57A is made of tungsten or polysilicon, the hard mask 57A loses selectivity with respect to the impurity diffusion region 54. Thus, when the SEG method is employed, silicon is grown even on the hard mask 57A. Because of this degraded selectivity, the hard mask 57A must be removed prior to applying the SEG method. However, if the hard mask 57A is made of nitride, it is not necessary to remove the hard mask 57A before the SEG method is performed.

In the first described conventional method for forming the plug 20 through a deposition method, there are generated seams in the plug 20 due to dependency on a profile of the inter-layer insulation layer 16. That is, because of the capping layer and the wet cleaning process, the profile of the inter-layer insulation layer 16 induces seams during the plug formation process. However, in the second conventional method, the remaining hard mask 57A provides another effect of improving a profile of the inter-layer insulation layer 56, thereby preventing seam generation in the plug 61. Herein, the profile of the inter-layer insulation layer 56 has a slightly inclined etch profile.

Even though the thickness of the hard mask 57A is preferably determined with consideration of a damaged portion of the hard mask 57A during the SAC etching process and another damaged portion of the hard mask 57A during the etching of the etch stop layer 55, it is difficult to obtain a precisely intended thickness of the hard mask 57A in an actual practice. Thus, the hard mask 57A is formed with a thicker thickness, and the remaining portion of the hard mask 57A after the etching of the etch stop layer 55 are removed by the planarization process for forming the plug 61. However, the remaining portion of the hard mask 57A may bring out a problem during the wet cleaning process performed for the purpose of securing the CD of the contact hole 60.

FIG. 6 is a micrograph of SEM showing hard masks lifted after a wet cleaning process.

As shown, a plurality of gate structures G1 to G4 are arranged in one direction, and a line type mask patterns P1 to P4 for forming a landing plug contact are arranged in a crossing direction to the gate structures G1 to G4. Herein, each of the mask patterns P1 to P4 has a stack structure of an inter-layer insulation layer and a hard mask. Also, a plurality of contact holes are formed between each two of the gate structures G1 to G4 by performing a SAC etching process with use of the mask patterns P1 to P4 and subsequently etching an etch stop layer. Among the contact holes, the contact holes with smaller sizes are for forming storage node contacts (SNC), while the contact holes with larger sizes are for forming bit line contacts (BLC).

However, the hard mask and the inter-layer insulation layer become separated at an interface between the hard mask and the inter-layer insulation layer during a cleaning process performed before deposition or growth of a material for forming a plug. At this time, the cleaning process uses such a cleaning agent like buffer oxide etchant (BOE). Because of this separation, the hard mask is lifted. Reference denotations 'HM1' and 'HM2' represent the lifted hard masks. This lifting phenomenon of the hard mask is more frequently created in a peripheral region of a memory device. Since an incidence of the lifting phenomenon is closely related to the size of the pattern, the lifting phenomenon occurs more frequently as the contact area becomes smaller. Therefore, the lifting phenomenon may become a serious problem in realizing a device with a linewidth less than 80 nm.

FIG. 7 is a picture showing a difference in height of a wafer in a center and in edges.

As shown, patterns may become severely defective because of a difference in height of an inter-layer insulation layer in a cell region and in a peripheral region depending on density of patterns and overly polished edges of a wafer during a CMP process.

SUMMARY OF THE INVENTION

It is, therefore, an object of the present invention to provide a method for fabricating a semiconductor device with the application of an ArF photolithography process capable of preventing a hard mask from being lifted due to a wet cleaning process and patterns from being defective due to a height difference between a cell region and a peripheral region.

In accordance with an aspect of the present invention, there is provided a method for fabricating a semiconductor device, including the steps of: forming a plurality of conductive structures on a substrate provided with a cell region and a peripheral region; forming an etch stop layer on the conductive structures; forming an inter-layer insulation layer on the etch stop layer; planarizing the inter-layer insulation layer and the etch stop layer by removing the inter-layer insulation layer and the etch stop layer until the conductive structures are exposed; forming a nitride layer for forming a hard mask on the planarized conductive structures and the inter-layer insulation layer; forming an anti-reflective coating layer on the nitride layer; forming a photoresist pattern on the anti-reflective coating layer through a photolithography process by using a light source of ArF; selectively etching the anti-reflective coating layer and the nitride layer with use of the photoresist pattern as an etch mask to thereby form a hard mask; removing the photoresist pattern and the anti-reflective coating layer; etching the inter-layer insulation layer disposed between conductive structures with use of the hard mask as an etch mask to thereby form at lest one contact hole exposing the etch stop layer; removing the exposed etch stop layer, thereby exposing the substrate; and cleaning inside the contact hole.

In accordance with another aspect of the present invention, there is provided a method for fabricating a semiconductor device, including the steps of: forming a plurality of conductive structures on a substrate provided with a cell region and a peripheral region; forming an etch stop layer on the conductive structures; forming an inter-layer insulation layer on the etch stop layer; planarizing the inter-layer insulation layer and the etch stop layer by removing the inter-layer insulation layer and the etch stop layer until the conductive structure are exposed; forming a nitride layer for forming a hard mask on the planarized conductive structures and the inter-layer insulation layer; forming an anti-reflective coating layer on the nitride layer; forming a photoresist pattern on the anti-reflective coating layer through a photolithography process by using a light source of ArF; selectively etching the anti-reflective coating layer and the nitride layer with use of the photoresist pattern as an etch mask to thereby form a hard mask; removing the photoresist pattern and the anti-reflective coating layer; etching the inter-layer insulation layer disposed between conductive structures with use of the hard mask as an etch mask to thereby form a contact hole exposing the etch stop layer; removing the exposed etch stop layer, thereby exposing the substrate; cleaning inside the contact hole; forming a conductive plug layer to be electrically connected with the exposed substrate; performing a first etch-back process for exposing the hard mask under a condition that the conductive plug layer is etched faster than the hard mask; and performing a second etch-back process for exposing the inter-layer insulation layer under a condition that the hard mask is etched faster than the conductive plug layer, thereby obtaining at least one isolated plug.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device with fine patterns in accordance with a preferred embodiment of the present invention will be described in detail with reference to the accompanying drawings.

FIGS. 8A to 8G are cross-sectional views illustrating a method for forming a fine pattern in a semiconductor device with use of an ArF photolithography process in accordance with a first embodiment of the present invention.

Figure 1A:
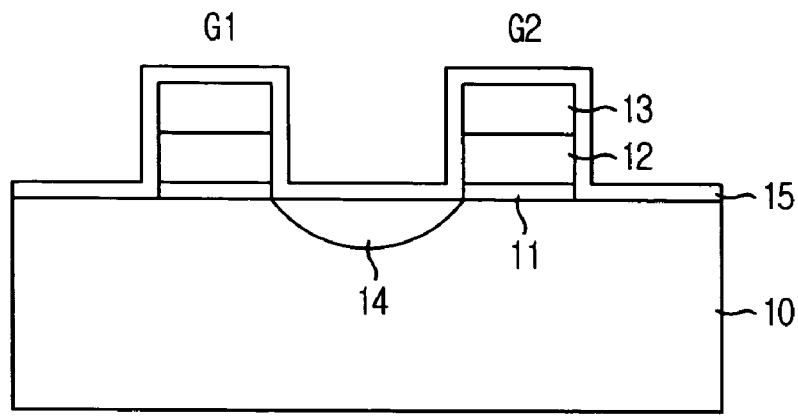
FIGS. 1A to 1D are cross-sectional views illustrating a first conventional method for forming a landing plug contact in a semiconductor device.
Figure 1B:
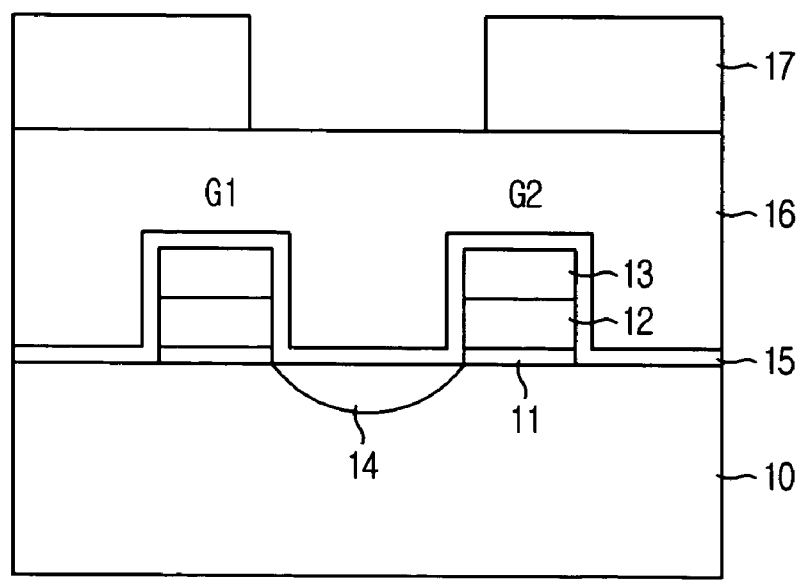
Figure 1C:
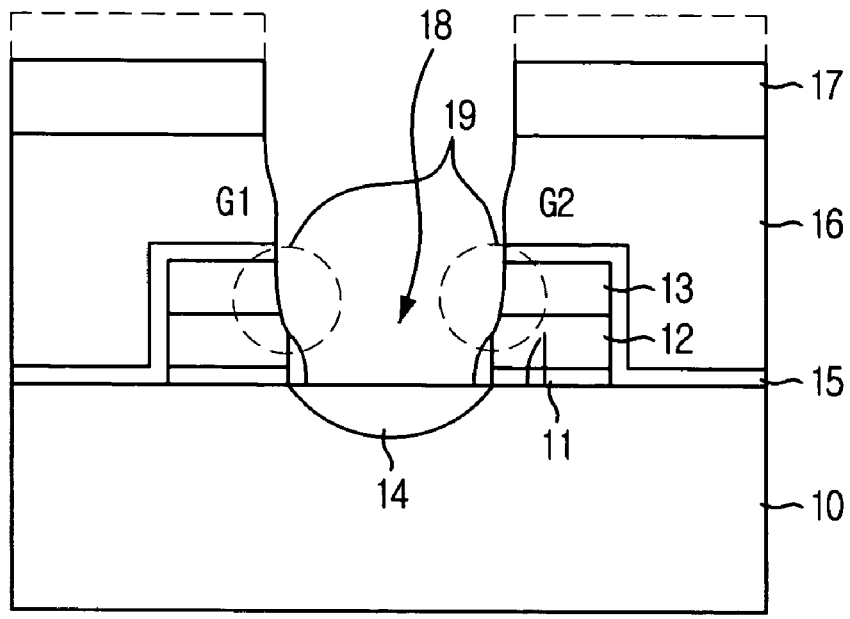
Figure 1D:
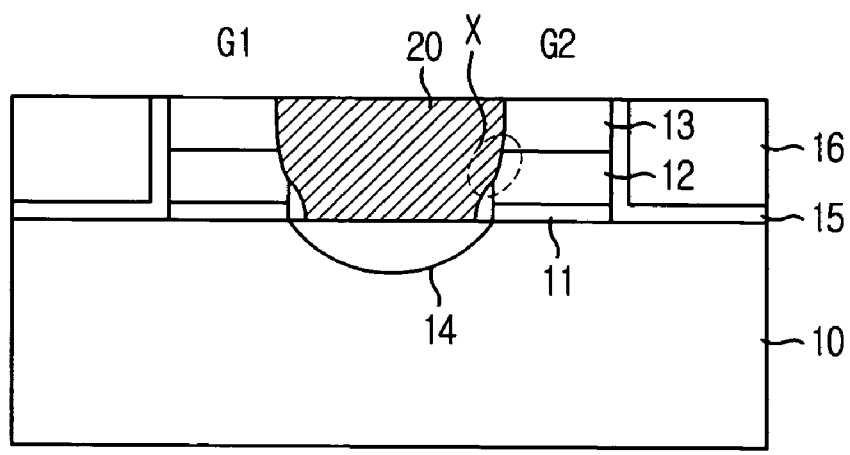
Figure 2:
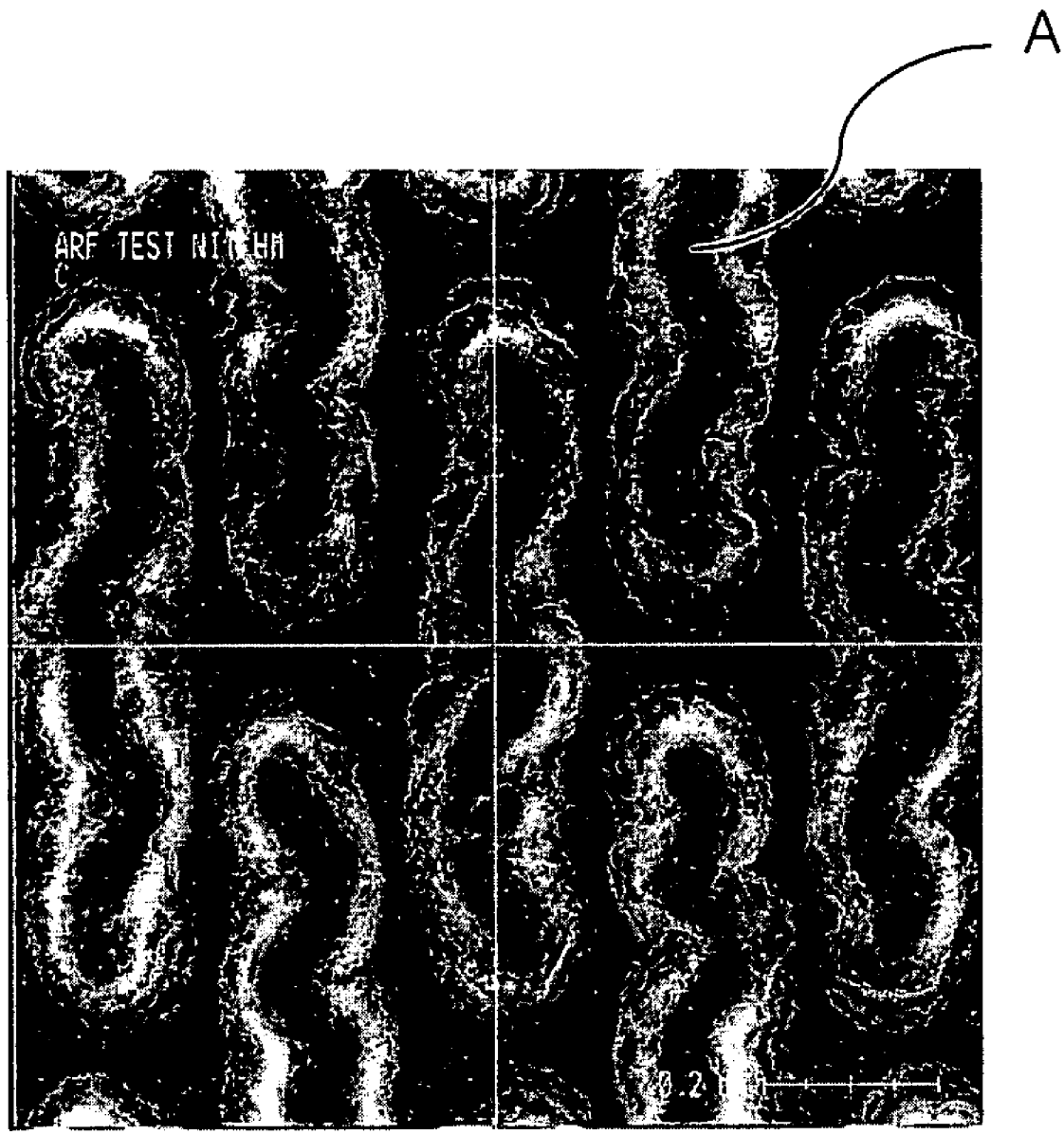
FIG. 2 is a micrograph of scanning electron microscopy (SEM) depicting a deformed ArF photoresist pattern.
Figure 3:
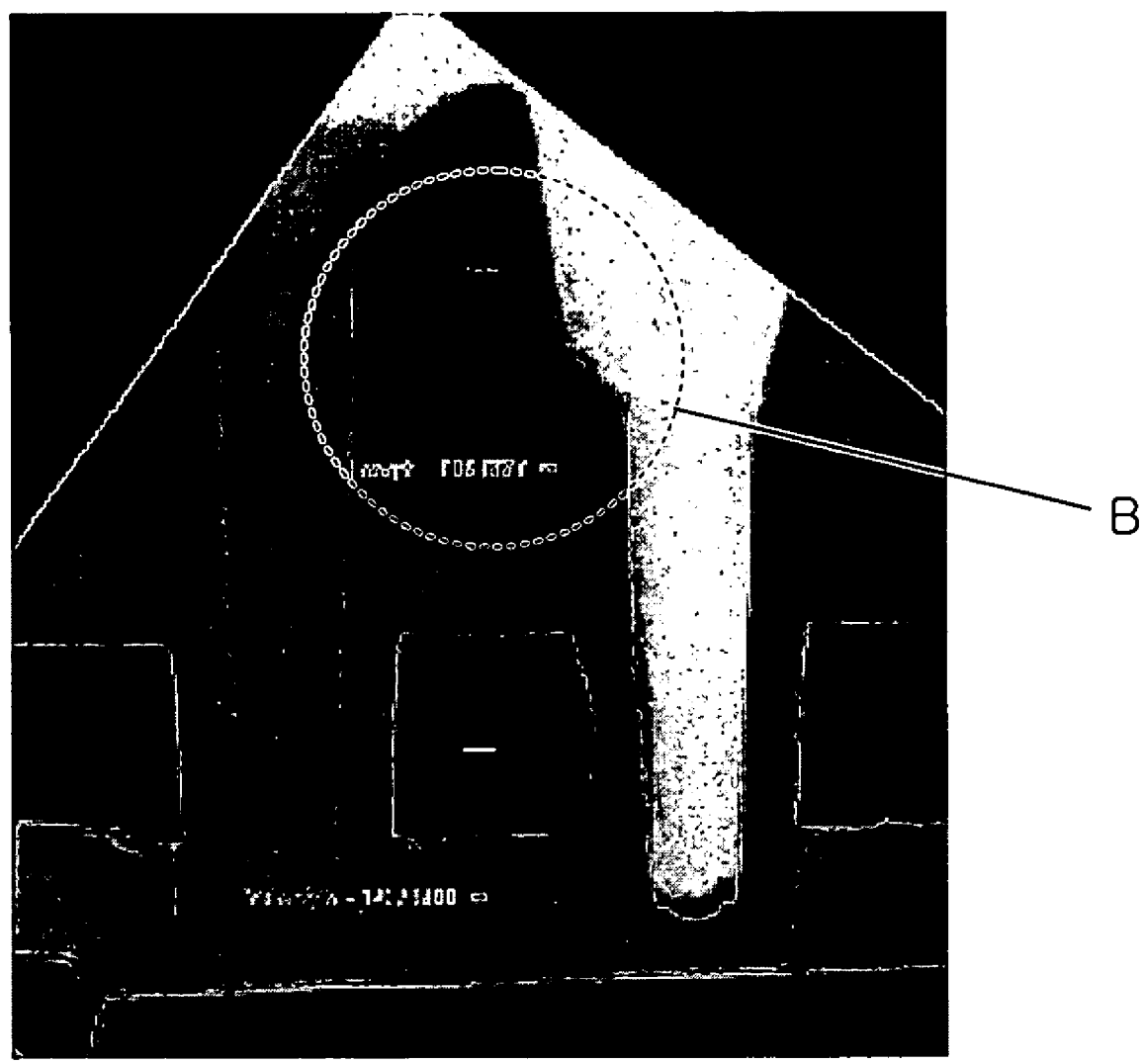
FIG. 3 is a micrograph of SEM showing a gate hard mask damaged during a conventional landing plug contact formation process employing an ArF photolithography process.
Figure 4A:
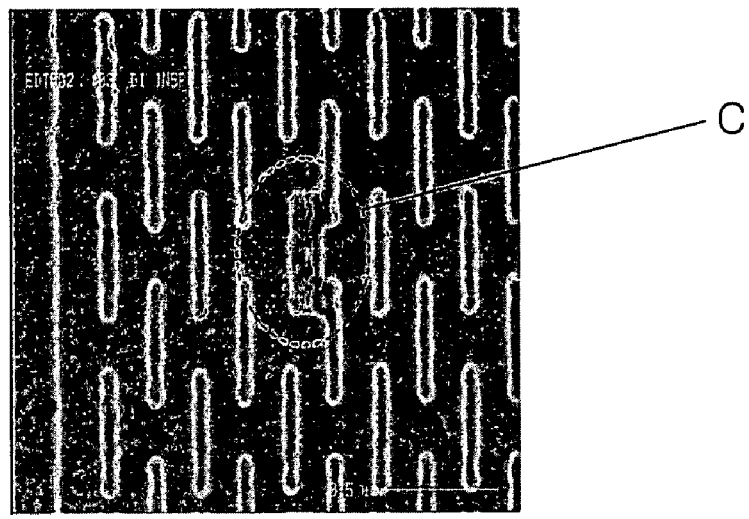
FIG. 4A is a micrograph of SEM showing a pattern collapse phenomenon during a conventional landing plug contact formation process employing an ArF photolithography process.
Figure 4B:
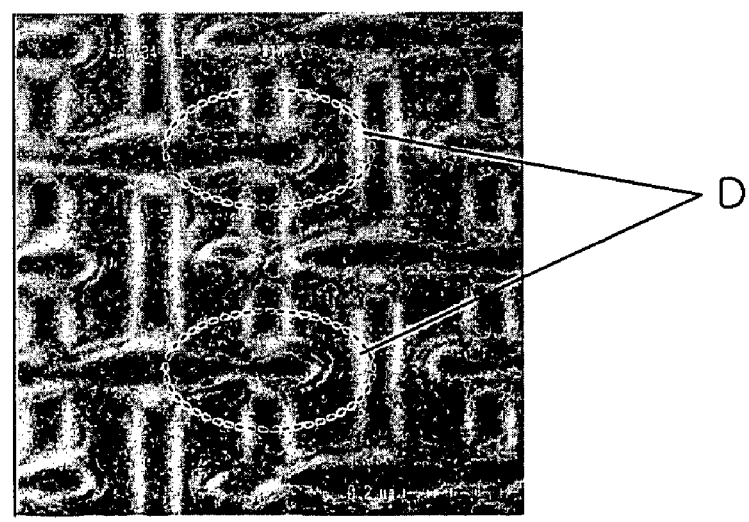
FIG. 4B is a micrograph of SEM showing defective photoresist patterns during a conventional landing plug contact formation process employing an ArF photolithography process.
Figure 5A:
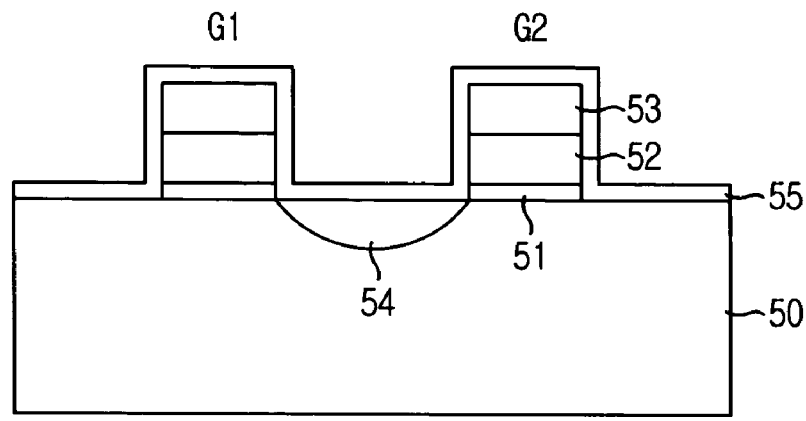
FIGS. 5A to 5F are cross-sectional views illustrating a second conventional method for forming a pattern in a semiconductor device by using an ArF photolithography device.
Figure 5B:
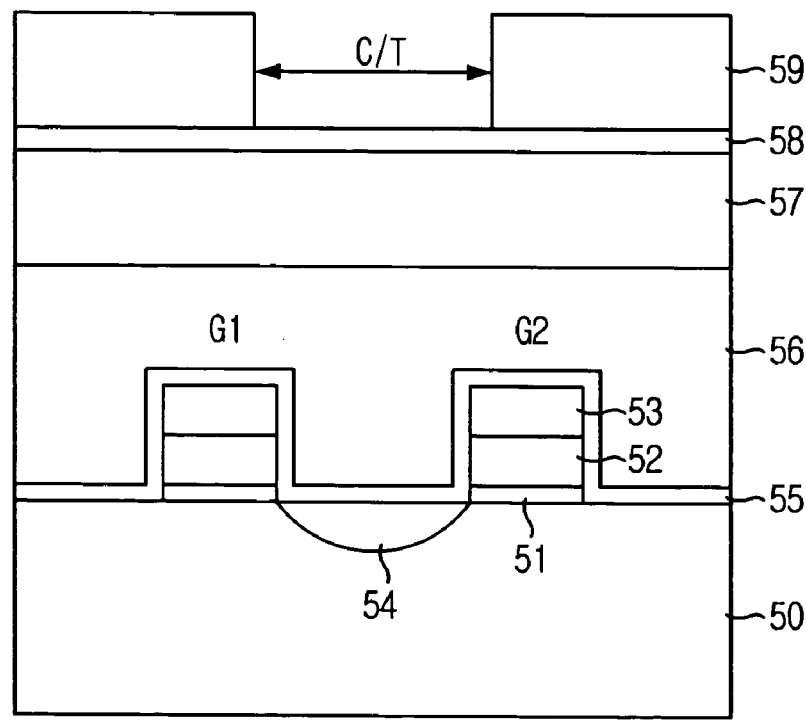
Figure 5C:
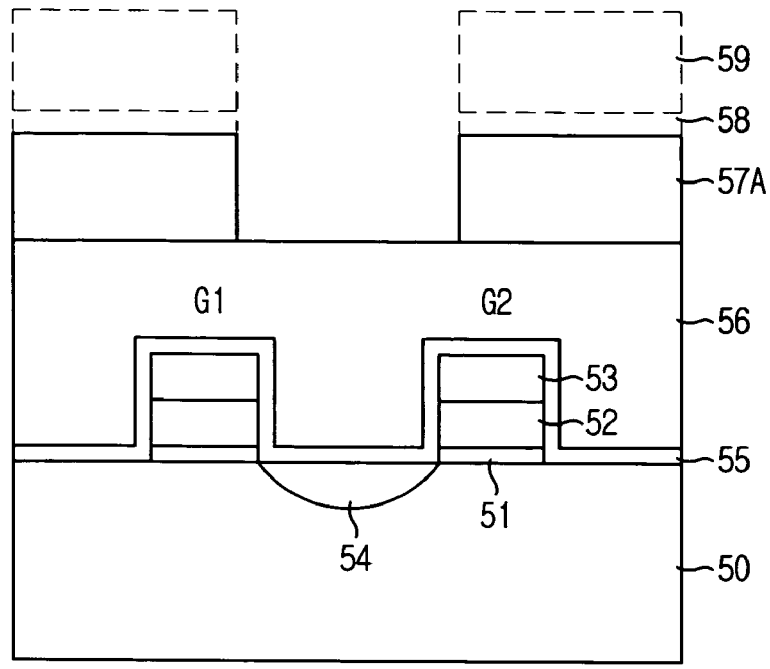
Figure 5D:
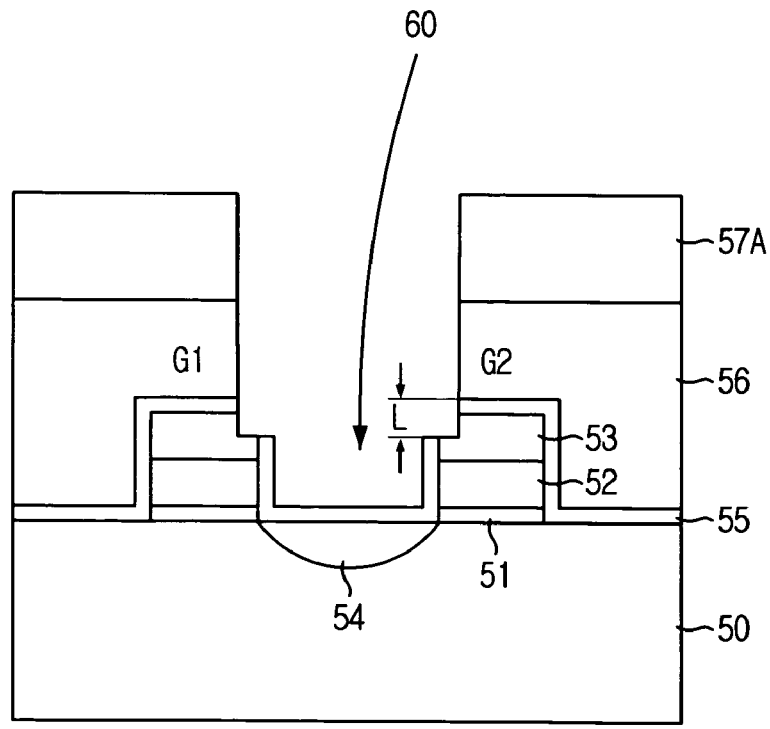
Figure 5E:
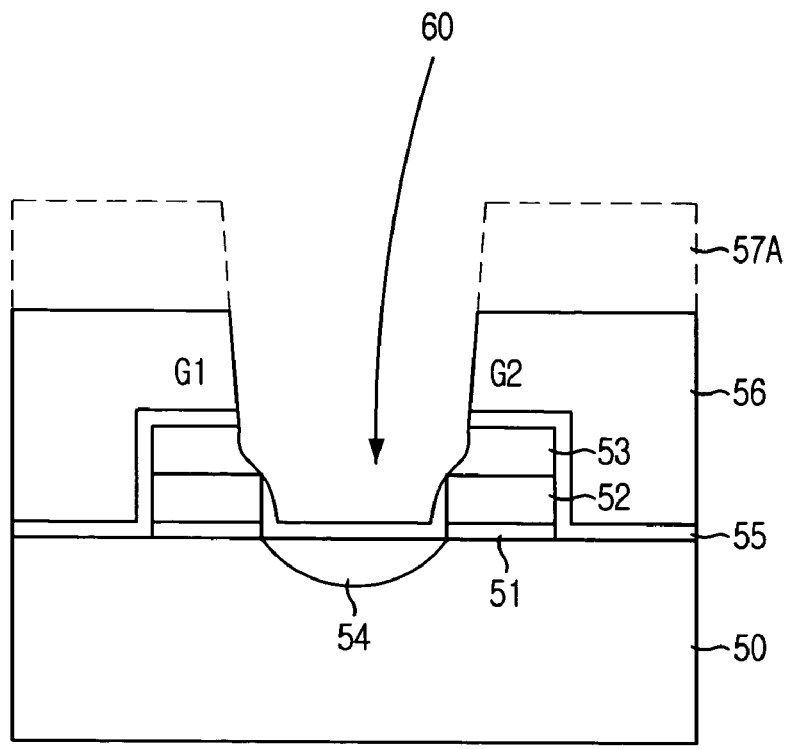
Figure 5F:
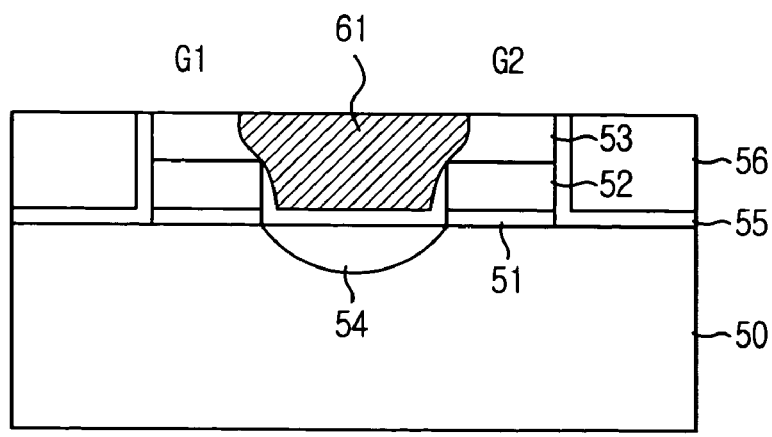
Figure 6:
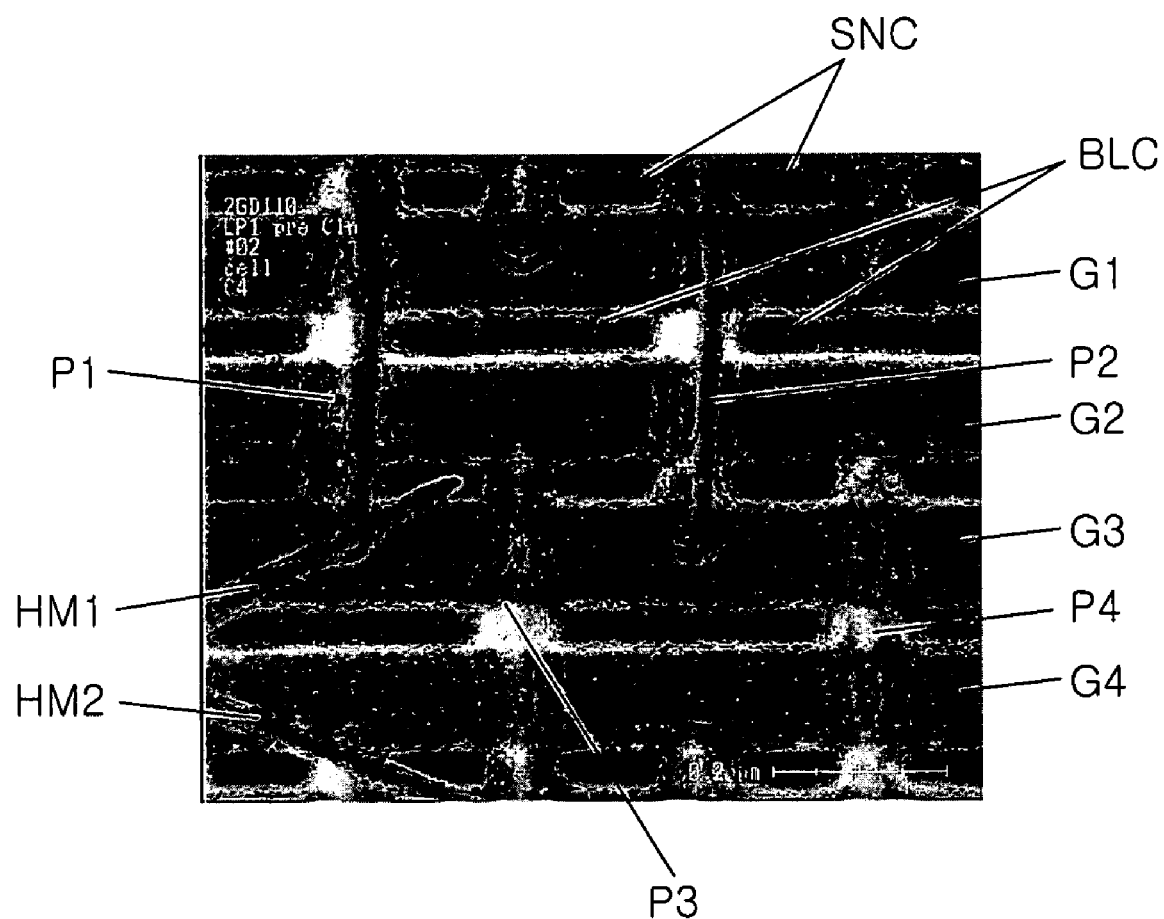
FIG. 6 is a micrograph of SEM showing conventional hard masks lifted after a wet cleaning process.
Figure 7:
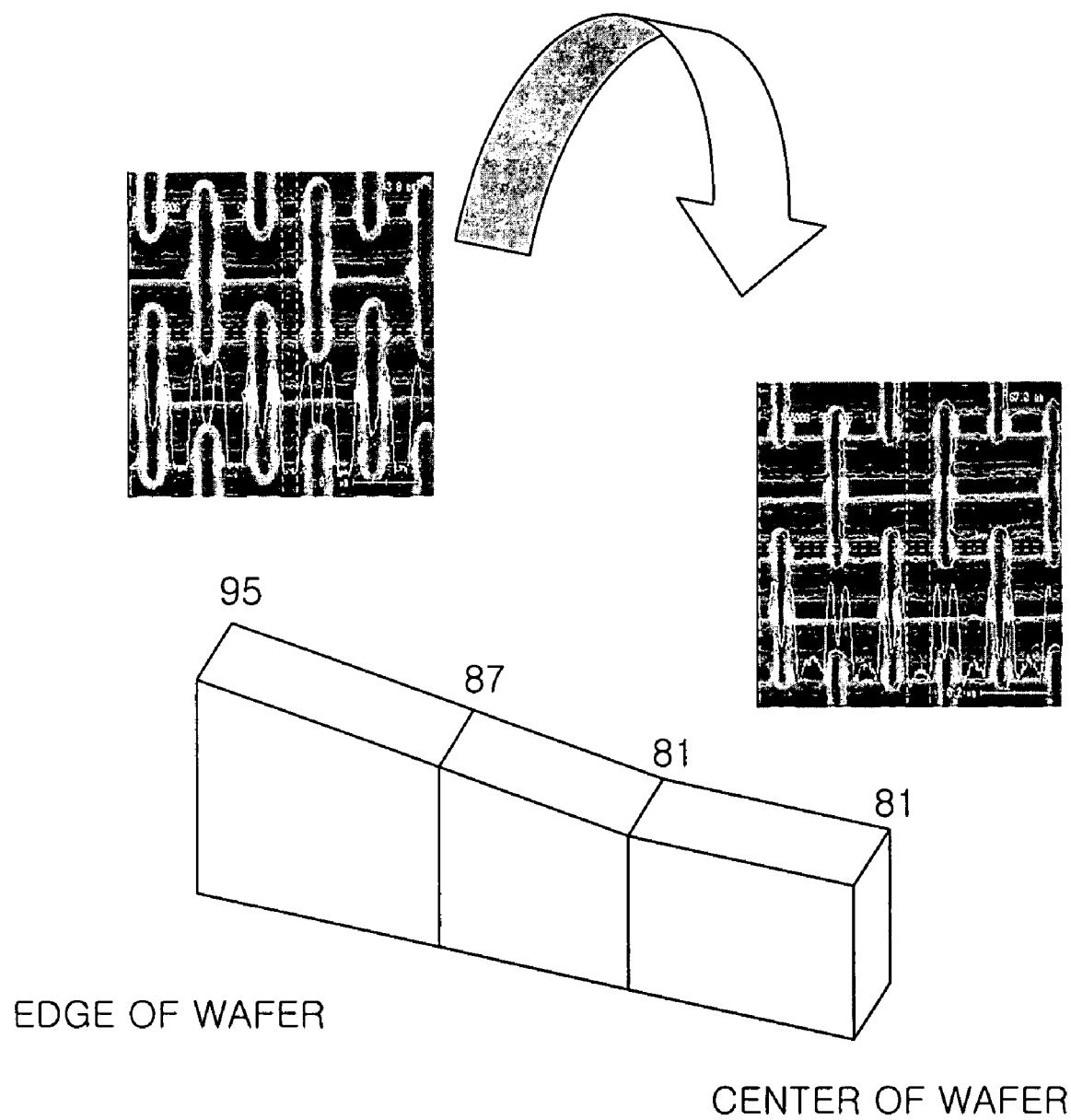
FIG. 7 is a picture showing a difference in height of a wafer in a center and in edges.
Figure 8A:
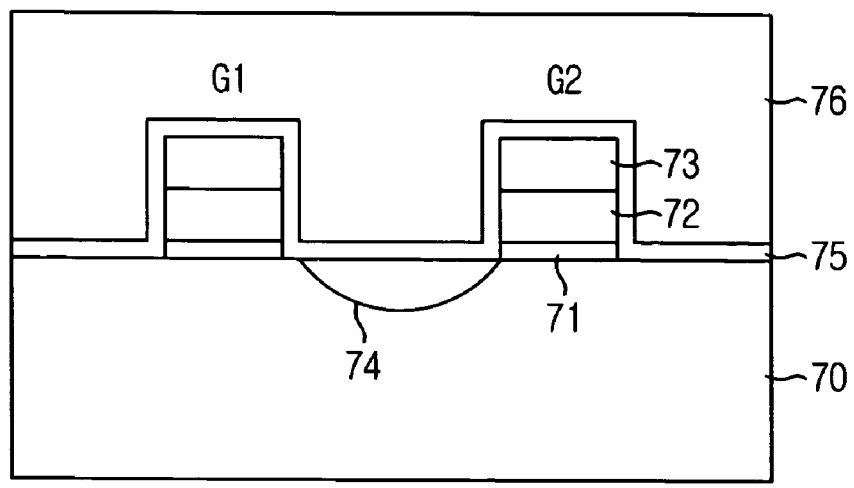
FIGS. 8A to 8G are cross-sectional views illustrating a method for forming a fine pattern in a semiconductor device with use of an ArF photolithography process in accordance with a first embodiment of the present invention.

Referring to FIG. 8A, a plurality of gate structures G1 and G2 are formed on a substrate 70 provided with various device elements. Each of the gate structures G1 and G1 includes a gate hard mask 73, a gate conductive layer 72 and a gate insulation layer 71.

Herein, the gate insulation layer 71 is made of a typical oxide-based material such as silicon oxide, and the gate conductive layer 72 is made of a material such as polysilicon, tungsten (W), tungsten nitride (WN), tungsten silicide ($WSi_x$), or combination thereof. The gate hard mask 73 serves a role in protecting the gate conductive layer 72 in the course of forming a contact hole by etching an inter-layer insulation layer during an etching process for forming a subsequent contact, and thus, the gate hard mask 73 is made of a material having a very different etch selectivity than the inter-layer insulation layer. For example, if the inter-layer insulation layer is made of an oxide-based material, the gate hard mask 73 is made of a nitride-based material such as silicon nitride (SiN) or silicon oxynitride (SiON). If the inter-layer insulation layer is made of a polymer-based low dielectric material, the gate hard mask 73 is made of an oxide-based material.

An impurity diffusion region 74 such as a source/drain junction is formed in the substrate 70 disposed between the gate structures G1 and G2. In general, if the source/drain junction is formed in the substrate 70 disposed between the gate structures G1 and G2 through performing an ion implantation method, impurities are ion implanted by the ion implantation method proceeding in alignment with the substrate 70. Then, a spacer is formed on sidewalls of each gate structure G1 and G2, and then, an ion implantation method is performed again to make a lightly doped drain (LDD) structure. Herein, detailed description on the steps of forming the LDD structure and the spacer is omitted.

Next, an etch stop layer 75 is formed on the gate structures G1 and G2. Herein, the etch stop layer 75 serves a role in stopping a self-aligned contact (SAC) etching process in order to protect the substrate 70 from being damaged by the SAC etching process. At this time, it is preferable that the etch stop layer 75 is formed along a profile of the gate structures G1 and G2 and is made of a nitride-based material such as silicon nitride or silicon oxynitride.

Next, an inter-layer insulation layer 76 made of an oxide-based material is formed on the etch stop layer 75. Herein, the inter-layer insulation layer 76 is made of a material selected from a group consisting of borophosphosilicate glass (BPSG), borosilicate glass (BSG), phosphosilicate glass (PSG), tetraethylorthosilicate (TEOS), high density plasma (HDP) oxide and spin on glass. It is still possible to use inorganic or organic low dielectric materials for forming the inter-layer insulation layer 76.

Figure 8B:
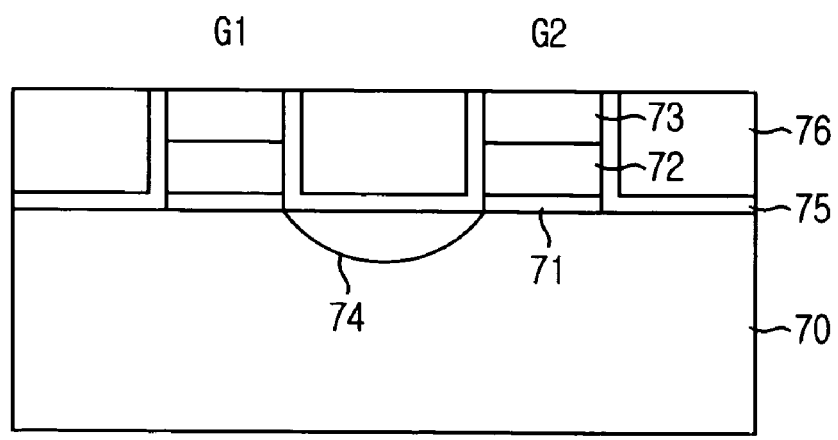

Referring to FIG. 8B, the inter-layer insulation layer 76 and the etch stop layer 75 are removed until the gate hard mask 73 is exposed, so that the inter-layer insulation layer 76 is planarized at the same level as the gate hard mask 73. At this time, the removal of the inter-layer insulation layer 76 proceeds by employing a CMP process. However, the CMP process should be carried out such that a damaged portion of the gate hard mask 73 is less than approximately 100 Å. Also, it is important to choose an appropriate type of slurry for the CMP process that gives uniformity of the gate hard mask 73 and the inter-layer insulation layer 76 after the CMP process.

Figure 8C:
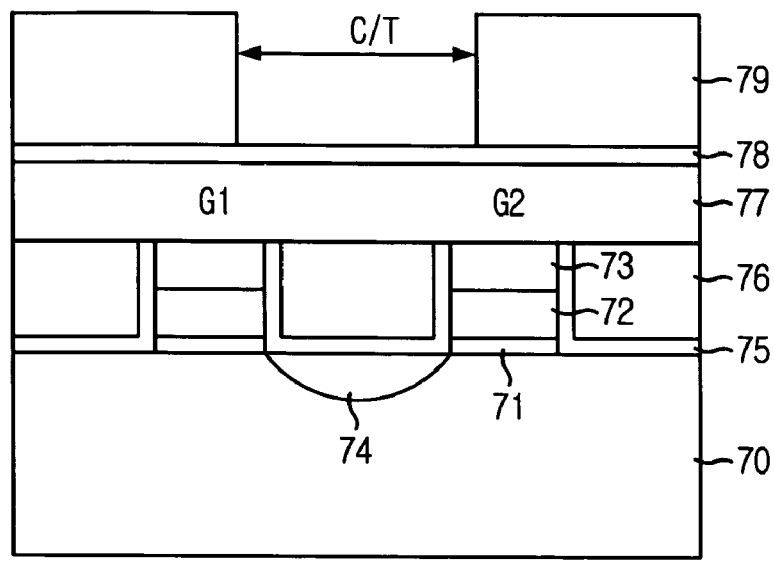

Referring to FIG. 8C, a nitride layer 77 for forming a hard mask is formed on the above inter-layer insulation layer 76. Herein, the nitride layer 77 has an insulating property and an etch selectivity with respect to the inter-layer insulation layer 76. Also, the nitride layer 77 is preferably formed by using one of plasma-enhanced nitride and low pressure nitride. Also, a thickness of the nitride layer 77 is determined with consideration of a portion of the nitride layer 77 being damaged when the inter-layer insulation layer 76 is subjected to a self-aligned contact (SAC) etching process and another portion of the nitride layer 77 being damaged when the impurity diffusion region 74 is exposed by etching the etch stop layer 75. That is, the nitride layer 77 preferably has a thickness equal to or greater than a thickness which allows the nitride layer 77 to be naturally removed in situ during the etching of the etch stop layer 75.

For instance, in a device with a linewidth less than approximately 100 nm fabricated according to the first embodiment of the present invention, a damaged thickness of the nitride layer 77 during the SAC etching process is approximately 300 Å, and a damaged thickness of the nitride layer 77 during the etching of the etch stop layer 75 is also approximately 300 Å. Under consideration of these damaged thicknesses of the nitride layer 77, the thickness of the nitride layer 75 is determined to be preferably in a range from approximately 500 Å to approximately 800 Å. However, this determined thickness can be varied depending on an applied reticle or a device.

After the formation of the nitride layer 77, an anti-reflective coating layer 78 is formed on the nitride layer 77. Herein, the anti-reflective coating layer 78 serves a role in preventing formation of undesired patterns, caused by scattering reflection occurring because the nitride layer 77 has a high index of reflection, during a photo-exposure process for forming a pattern and in improving adhesion between the nitride layer 77 and a subsequent photoresist pattern. At this time, it is preferable to form the anti-reflective coating layer 78 with an organic-based material having a similar etch characteristic to the photoresist pattern. Also, it is possible to omit the formation of the anti-reflective coating layer 78.

Afterwards, the above mentioned photoresist pattern 79 for forming a landing plug contact is formed by a series of processes. A reference denotation 'C/T' expresses a region in which a contact hole for a landing plug contact will be formed. Although not illustrated, the photoresist pattern 79 is first prepared by forming a photoresist layer for use in an ArF photolithography device on the anti-reflective coating layer 78 through performing a spin coating method. The photoresist layer is selectively photo-exposed by using an ArF photolithography device and a predetermined reticle for defining a width of a contact hole. A developing process is then employed to make photo-exposed portions or non-photo-exposed portions remain, and a cleaning process is subsequently employed to remove etch remnants.

Compared with the case of forming a hard mask with tungsten or polysilicon, the use of nitride as a hard mask material makes it possible to align the mask, i.e., the photoresist pattern 79, without an additional alignment key opening process, because nitride has a low index of reflection compared with polysilicon and tungsten.

Since the photoresist layer needs to be formed with a thickness required for etching the thin nitride layer 77, the thickness of the photoresist layer is less than that of the conventional hard mask material such as polysilicon or tungsten. As a result of this thinly formed nitride layer 77, it is possible to form a fine pattern without an incidence of pattern collapse phenomenon.

Thus, this thin photoresist layer can be applied in a device with a linewidth less than approximately 80 nm. For instance, an expected thickness of the photoresist layer in an 80 nm semiconductor device is approximately 1,500 Å, and thus, a minimum thickness of the photoresist layer required for etching the nitride layer 57 having a thickness of approximately 700 Å is expected to be approximately 1,000 Å.

Figure 8D:
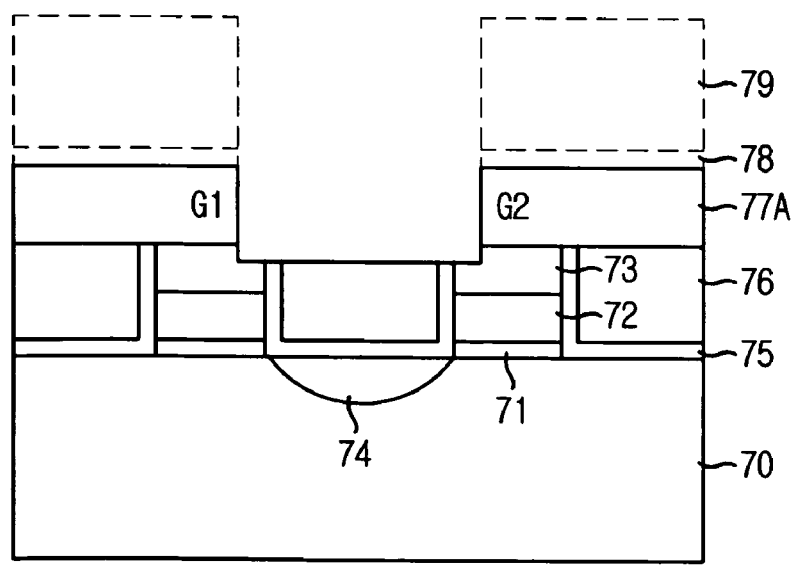

Referring to FIG. 8D, the anti-reflective coating layer 78 and the nitride layer 77 are etched with use of the photoresist pattern 79 as an etch mask to thereby forming a hard mask 77A.

If an ArF photolithography process is employed, it is difficult to set up a process recipe of etching the nitride layer 77 formed in a line type. Therefore, it is important to secure a process recipe effectively applicable for the nitride layer 77 having a thickness less than approximately 1,000 Å. To achieve this intended thickness of the nitride layer 77, it is necessary to apply a process recipe advantageous in suppressing occurrences of striation and deformation to an intended pattern structure. That is, an electrode temperature is lower, and a plasma source and a bias should be independently controlled. Also, a bias power should be extremely low.

One exemplary preferable process recipe, obtained when a super capacitive coupled plasma module (SCCM) etching device is used, is that a chamber pressure of approximately 50 mTorr, a source power of approximately 1,000 W, a bias power of approximately 200 W are provided along with $O_2$ gas and $CF_4$ gas with a respective flow quantity of approximately 20 sccm and approximately 100 sccm and an electrode temperature maintained at approximately 0° C.

This process recipe makes the anti-reflective coating layer 78 made of an organic material and the nitride layer 77 etched simultaneously. This simultaneous etching of the anti-reflective coating layer 78 and the nitride layer 77 is important to realize an intended structure of the hard mask 77A. Also, it is possible to control a critical dimension (CD) of the hard mask 77A formed in a bar type by controlling the use of an etch gas and an etching time. As a result, it is further possible to increase a margin for securing a sufficient CD of a bottom of a contact hole which will be formed by performing a SAC etching process.

Then, the photoresist pattern 79 is removed by employing an ashing process. If the anti-reflective coating layer 78 is made of an organic material, the anti-reflective coating layer 78 is simultaneously removed by the above ashing process. The ashing process can be one of a photoresist stripping process and an oxygen plasma treatment. A remaining portion of the photoresist pattern 79 may become a factor for forming defective patterns during a subsequent SAC etching process.

Figure 8E:
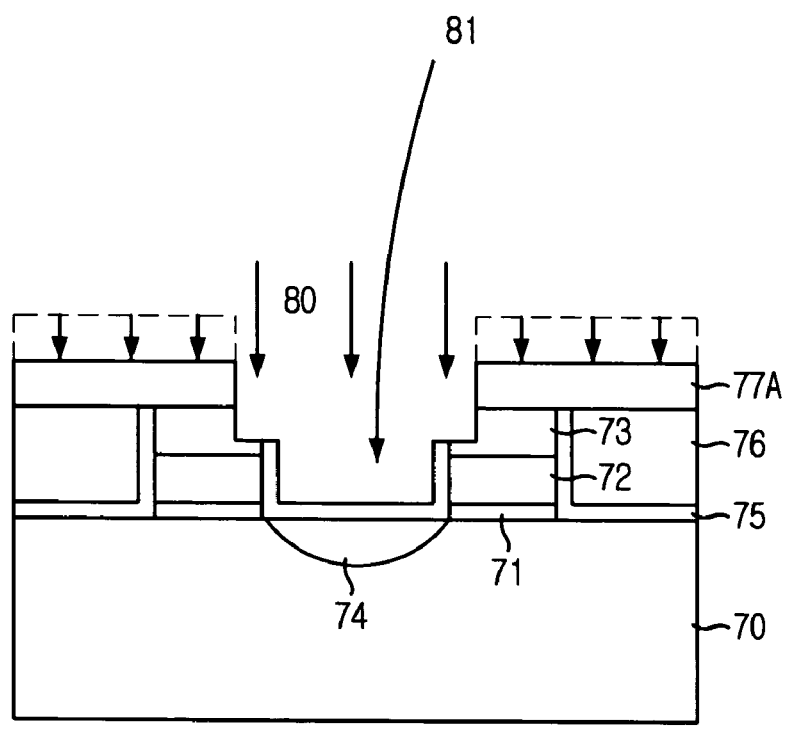

Referring to FIG. 8E, the inter-layer insulation layer 76 is etched by using the hard mask 77A as an etch mask until the etch stop layer 75 disposed between the gate structures G1 and G2 is exposed. This etching process is a SAC etching process denoted with a reference numeral 80. From this SAC etching process 80, a contact hole 81 is formed.

At this time, since the SAC etching process 80 can proceed without considering deformation of the photoresist pattern 79 shown in FIG. 8D, a typical SAC process recipe that maximizes etch selectivity of the inter-layer insulation layer 76 with respect to the hard mask 77A and secures a sufficient CD of a bottom of the contact hole 81 is employed. Because supply of a carbon source gas is limited due to the photoresist layer, it is essential to use a gas providing higher selectivity compared with gases typically employed in the SAC etching process. Thus, the use of gases generating lots of $CF_2$ radicals such as $C_4F_6$ and $C_5F_8$ is preferred to such a conventionally used gas of $C_4F_8$.

Also, it is necessary to set the process recipe appropriately in order to secure the CD of the bottom of the contact hole 81 susceptible to such a gas providing high selectivity. More specifically, an electrode temperature of approximately 40°

C. is used to improve the selectivity, and oxygen is added to secure the CD of the bottom of the contact hole 81.

One exemplary preferable process recipe obtained when a super capacitive coupled plasma module (SCCM) etching device is used is that a chamber pressure of approximately 40 mTorr, a source power of approximately 500 W, a bias power of approximately 1,200 W are provided along with $C_xF_8$ gas, Ar gas and $O_2$ gas with a respective flow quantity of approximately 7 sccm, approximately 800 sccm and approximately 5 sccm and an electrode temperature maintained at approximately 40° C.

As shown in FIG. 8D, the hard mask 77A is contacted to the gate hard mask 73 by removing the inter-layer insulation layer 76, and thus, an etch target of the SAC etching process is decreased as much as the removed portion of the inter-layer insulation layer 76. This effect further provides an effect of increasing a process margin. For instance, in the conventional SAC etching process, a thickness of a damaged portion of the gate hard mask ranges from approximately 300 Å to approximately 400 Å. However, in accordance with the first embodiment, because of the decreased thickness of the etch target, the damaged portion of the gate hard mask 73 can be decreased to a thickness ranging from approximately 100 Å to approximately 200 Å, and an etching period is also shortened. In addition, the thickness of the inter-layer insulation layer 76 decreases from approximately 5,000 Å to approximately 3,500 Å. This decreased thickness of the inter-layer insulation layer 76, i.e., approximately 1,500 Å, makes it possible to extend the CD of the bottom of the contact hole 81 by approximately 10%.

Compared with the conventional SAC etching process using the photoresist pattern as an etch mask, because of this pronounced decrease of the gate hard mask 73, the totally damaged portion of the gate hard mask 73 is reduced even with adding approximately 300 Å of the damaged portion of the gate hard mask 73 during the removal of the etch stop layer 75. As a result, it is not necessary to protect the gate hard mask 73 by forming a capping layer on the gate structures G1 and G2 with use of undoped silicate glass (USG).

This omission of the formation of the capping layer provides an effect of achieving a simplified process and another effect of preventing an incidence of non-opened contact occurring when the etch stop layer 75 is etched due to the non-uniformly deposited capping layer within the contact hole 81.

Figure 8F:
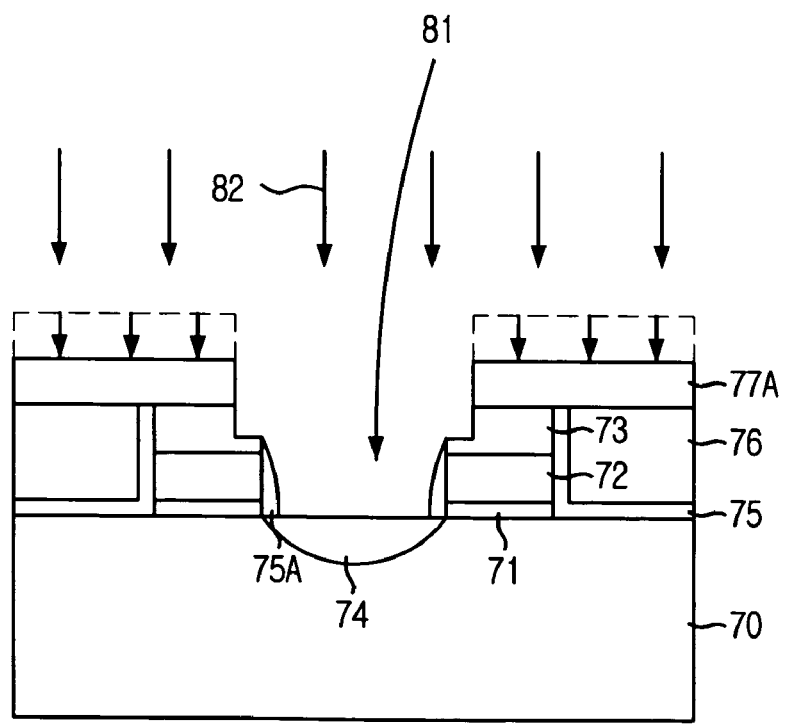

Referring to FIG. 8F, the exposed portion of the etch stop layer 75 is removed, thereby exposing the impurity diffusion region 74. The removal of the etch stop layer 75 proceeds by employing a blanket etch-back process as denoted with a reference numeral 82. At this time, the gate hard mask 73 is damaged with a thickness the same as the removed thickness of the etch stop layer 75, i.e., approximately 300 Å. Thus, the total thickness of the damaged gate hard mask 73 ranges from approximately 400 Å to approximately 500 Å.

As described above, it is preferable to remove the remaining portion of the hard mask 77A in situ as the exposed portion of the etch stop layer 75 is removed. However, it is practically difficult to control this removal of the hard mask 77A, and thus, the hard mask 77A still remains on the gate hard mask 73 even after the removal of the etch stop layer 75.

Since the hard mask 77A is made of a nitride-based material, it is possible to proceed with a series of landing plug contact formation processes in situ using the same equipment. For instance, in case of using a two chamber body equipment with a photoresist stripper, the hard mask formation process and a photoresist stripping process can be performed in one chamber, while the SAC etching process and the removal of the etch stop layer can proceed in another chamber. In this case, the substrate 70 provided with the photoresist pattern 79 is preferably loaded into the above two chamber body equipment. This use of the nitride-based material for forming the hard mask 77A solves the problem of performing the etching process for forming the hard mask made of a polysilicon or tungsten ex situ and thus, shortening a turn around time (TAT).

Figure 8G:
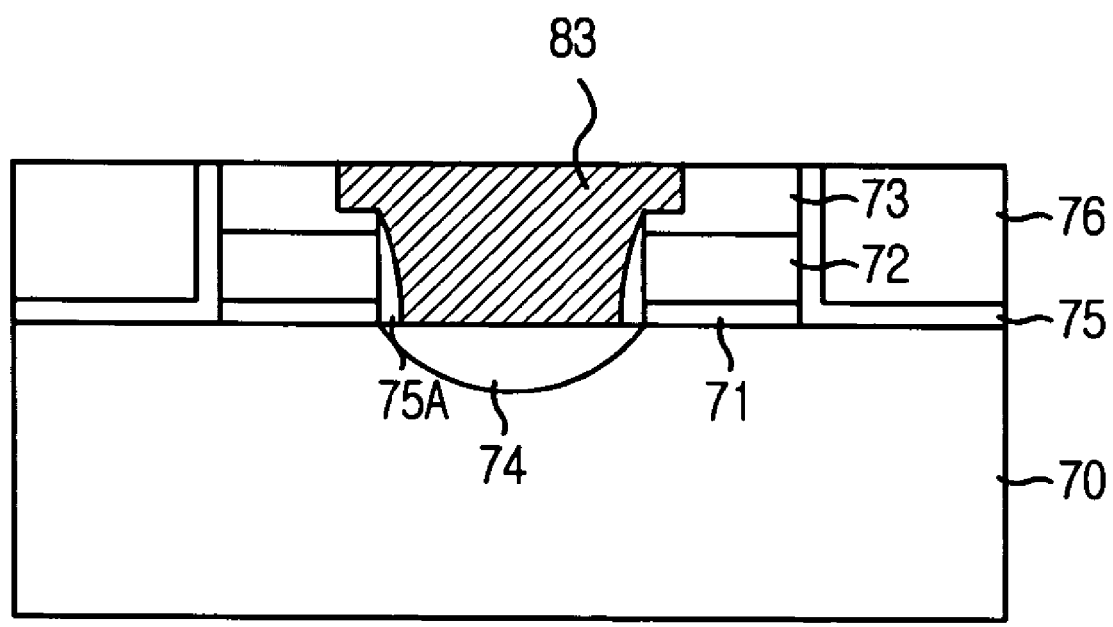

Referring to FIG. 8G, a conductive material for forming a plug is filled into the contact hole 81, and a planarization process is performed until the gate hard mask 73 is exposed to thereby form a plug 83 electrically connected with the impurity diffusion region 74 through the contact hole 81 and planarized at the same level of the gate hard mask 73.

For the planarization process, an etch-back process is performed to the above conductive material to decrease a height difference between a cell region and a peripheral region prior to performing a chemical mechanical polishing (CMP) process. Meanwhile, the hard mask 77A can be set to remain in the peripheral region by forming the nitride layer 77 thickly in regions except for the peripheral region, or by removing the etch stop layer 75 with use of a mask opening the cell region instead of performing the blanket etch-back process.

The reason for making the hard mask 77A remain in the peripheral region is to prevent the gate structures G1 and G2 in the peripheral region from being damaged during the subsequent CMP process. This damage to the gate structures G1 and G2 occurs as a result of a difference in density of the gate structures G1 and G2 in the cell region and in the peripheral region. By protecting the gate structures G1 and G2 with the hard mask 77A, it is possible to increase a process margin of the CMP process.

In addition, instead of performing the CMP process under the target of exposing the gate hard mask 73, depending on a mask type, the CMP process can be also carried out until a portion of the inter-layer insulation layer 76 remains. Also, polysilicon is most commonly used as the conductive material, and a barrier metal of Ti and TiN can be used as the conductive material in addition to the use of polysilicon. Instead of using polysilicon, tungsten can be used.

Since the hard mask 77A is made of nitride having an insulation property, it is possible to form the plug 83 made of polysilicon through a deposition method or through a selective epitaxial growth (SEG) method. In more detail of the SEG method, if the hard mask 77A is made of tungsten or polysilicon as like the first conventional method, the hard mask 77A loses selectivity with respect to the impurity diffusion region 74. Thus, when the SEG method is employed, silicon is grown even on the hard mask 77A. Because of this degraded selectivity, the hard mask 77A must be removed prior to performing the SEG method. However, since the hard mask 77A is made of nitride, it is not necessary to remove the hard mask 77A before the SEG method is preformed. Therefore, it is possible to form the hard mask 77A with regardless of the plug formation process even in a sub 80 nm semiconductor device.

In the conventional method of forming a plug in the absence of a hard mask through a deposition method, there are generated seams in the plug due to dependency on a profile of an inter-layer insulation layer. That is, because of a capping layer and a wet cleaning process, the profile of the inter-layer insulation layer induces seams during the plug formation process. In contrast, in accordance with the first embodiment, the remaining portion of the hard mask 77A provides another effect of improving a profile of the inter-layer insulation layer 76, thereby preventing seam generation in the plug 83. Herein, the profile of the inter-layer insulation layer 76 has a slightly inclined etch profile.

Hereinafter, there are provided detailed descriptions of various applications of the first embodiment to solve problems related to the presence or absence of the hard mask during a series of landing plug contact formation processes.

Figure 9:
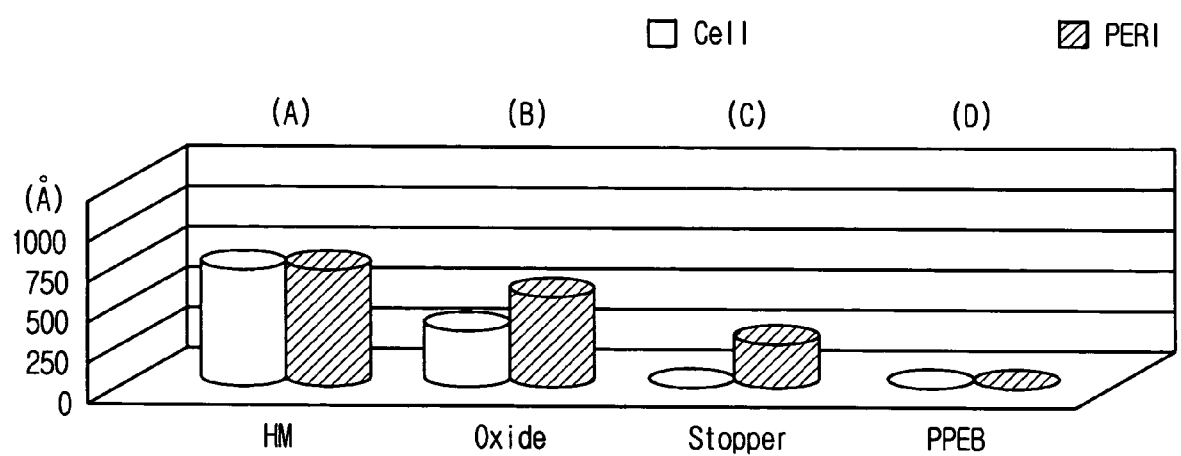
FIG. 9 is a graph showing changes in a thickness of each layer of a substrate structure when a thickness of a hard mask is determined to be approximately 670 Å.

FIG. 9 is a graph showing changes in a thickness of each layer of a substrate structure when a thickness of a hard mask is determined to be approximately 670 Å.

With reference to FIG. 9, changes in a thickness of the hard mask will be described in detail. Table 1 provided below shows the changes in the thickness of the hard mask in a cell region and in a peripheral region when a series of landing plug contact processes are carried out.

TABLE 1

| Thickness of Hard Mask | Cell Region | Peripheral Region |
|---|---|---|
| (A) Initially formed hard mask (Å) | 670 | 670 |
| (B) Remaining hard mask after a SAC etching process (Å) | 300 | 500 |
| (C) Remaining hard mask after a contact opening process (Å) | 0 | 200 |
| (D) Remaining hard mask after a plug formation process (Å) | 0 | 0 |

With reference to FIG. 9 and Table 1, at Step (A), the initially formed hard mask has a thickness of approximately 670 Å, and at Step (B), a thickness of a damaged portion of the hard mask formed in the cell region is approximately 370 Å, while that of a damaged portion of the hard mask formed in the peripheral region is approximately 170 Å, and thus, thicknesses of the remaining hard mask in the cell region and in the peripheral region are approximately 300 Å and approximately 500 Å, respectively.

At Step (C) of removing the etch stop layer by performing a blanket etch-back process, approximately 300 Å of the hard mask in the cell region and in the peripheral region is damaged, thereby obtaining the hard mask of approximately 200 Å remaining in the peripheral region. After the removal of the etch stop layer, the hard mask in the cell region does not remain. At this time, the hard mask does not remain on the inter-layer insulation layer since the hard mask is also removed in situ while the etch stop layer is removed by the blanket etch-back process. Therefore, it is possible to prevent the hard mask from being lifted during a subsequent wet cleaning process.

At step (D) of forming the plug by performing an etch-back process and/or a CMP process, the hard mask does not remain in the cell region and in the peripheral region.

Figure 10:
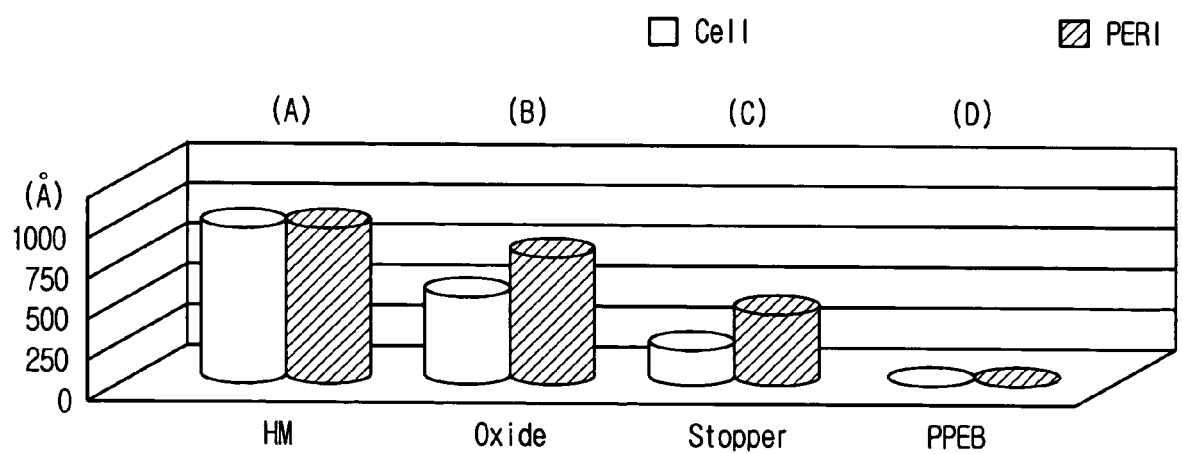
FIG. 10 is a graph showing changes in a thickness of each layer of a substrate structure when a thickness of a hard mask is determined to be approximately 900 Å.

FIG. 10 is a graph showing changes in a thickness of each layer of a substrate structure when a thickness of a hard mask is determined to be approximately 900 Å.

With reference to FIG. 10, changes in a thickness of the hard mask will be described in detail. Table 2 provided below shows the changes in the thickness of the hard mask in a cell region and in a peripheral region when a series of landing plug contact processes are carried out.

TABLE 2

| Thickness of Hard Mask | Cell Region | Peripheral Region |
|---|---|---|
| (A) Initially formed hard mask (Å) | 900 | 900 |
| (B) Remaining hard mask after a SAC etching process (Å) | 500 | 740 |
| (C) Remaining hard mask after a contact opening process (Å) | 140 | 380 |
| (D) Remaining hard mask after a plug formation process (Å) | 0 | 0 |

With reference to FIG. 10 and Table 2, at Step (A), the initially formed hard mask has a thickness of approximately 900 Å, and at Step (B), a thickness of a damaged portion of the hard mask formed in the cell region is approximately 400 Å, while that of a damaged portion of the hard mask formed in the peripheral region is approximately 160 Å, and thus, thicknesses of the remaining hard mask in the cell region and in the peripheral region are approximately 500 Å and approximately 740 Å, respectively.

At Step (C) of removing the etch stop layer by performing a blanket etch-back process, approximately 360 Å of the hard mask in the cell region and in the peripheral region is damaged, thereby obtaining the hard mask with a remaining thickness of approximately 140 Å in the cell region and the hard mask with a remaining thickness of approximately 380 Å in the peripheral region.

At step (D) of forming the plug by performing an etch-back process and/or a CMP process, the hard mask does not remain in the cell region and in the peripheral region.

Particularly, after Step (C), the hard mask in the cell region still remains with a thickness of approximately 140 Å on the inter-layer insulation layer, resulting in a higher probability that the hard mask may be lifted during a subsequent wet cleaning process.

As mentioned previously in the first embodiment of the present invention, this problem can be solved by polishing the inter-insulation layer until the inter-layer insulation layer is planarized at the same level of the gate hard mask and then forming the hard mask on the resulting structure.

Figure 11:
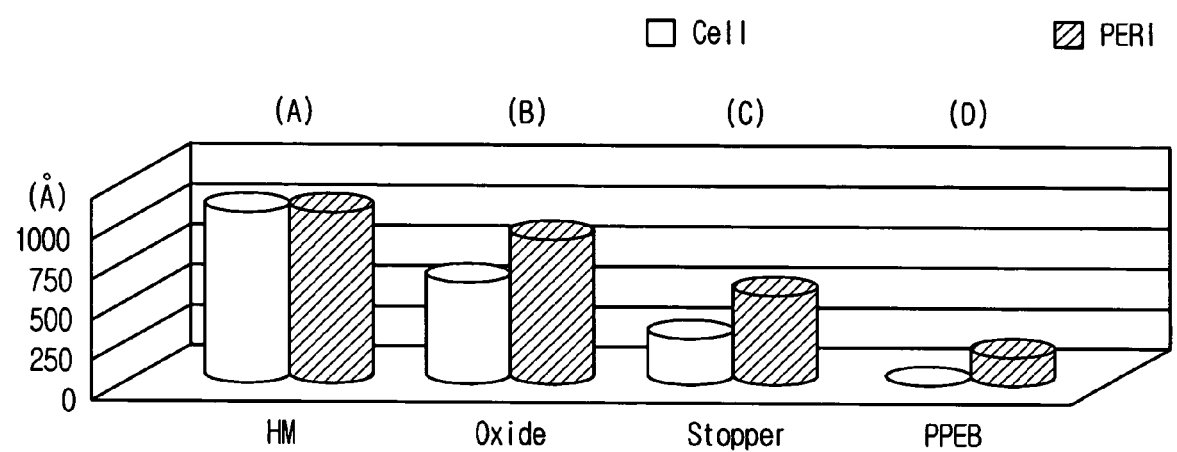
FIG. 11 is a graph showing changes in a thickness of each layer of a substrate structure when a thickness of a hard mask is determined to be approximately 1,000 Å.

FIG. 11 is a graph showing changes in a thickness of each layer of a substrate structure when a thickness of a hard mask is determined to be approximately 1,000 Å.

With reference to FIG. 11, changes in a thickness of the hard mask will be described in detail. Table 3 provided below shows the changes in the thickness of the hard mask in a cell region and in a peripheral region when a series of landing plug contact processes are carried out.

TABLE 3

| Thickness of Hard Mask | Cell Region | Peripheral Region |
|---|---|---|
| (A) Initially formed hard mask (Å) | 1,000 | 1,000 |
| (B) Remaining hard mask after a SAC etching process (Å) | 600 | 830 |
| (C) Remaining hard mask after a contact opening process (Å) | 250 | 500 |
| (D) Remaining hard mask after a plug formation process (Å) | 0 | 100 |

With reference to FIG. 11 and Table 3, at Step (A), the initially formed hard mask has a thickness of approximately 1,000 Å, and at Step (B), a thickness of a damaged portion of the hard mask formed in the cell region is approximately 400 Å, while that of a damaged portion of the hard mask formed in the peripheral region is approximately 170 Å, and thus, thicknesses of the remaining hard mask in the cell region and in the peripheral region are approximately 600 Å and approximately 830 Å, respectively.

At Step (C) of opening a contact region by removing the etch stop layer through the use of a blanket etch-back process, approximately 350 Å of the hard mask in the cell region and approximately 330 Å of the hard mask in the peripheral region are damaged, thereby obtaining the hard mask of approximately 250 Å remaining in the cell region and the hard mask of approximately 500 Å remaining in the peripheral region.

At step (D) of forming the plug by performing an etch-back process and/or a CMP process, the hard mask does not remain in the cell region, while the hard mask in the peripheral region remains with a thickness of approximately 100 Å.

Particularly, after the contact region is opened by removing the etch stop layer, the hard mask in the cell region remains with a thickness of approximately 250 Å. Thus, as mentioned above, this remaining hard mask may be lifted during the subsequent wet cleaning process using a cleaning solution of buffered oxide etchant (BOE). Therefore, as described in the first embodiment, this problem of the lifting phenomenon can be solved by forming the hard mask on the inter-layer insulation layer that is previously polished until the inter-layer insulation layer is planarized at the same level of the gate hard mask.

Figure 12:
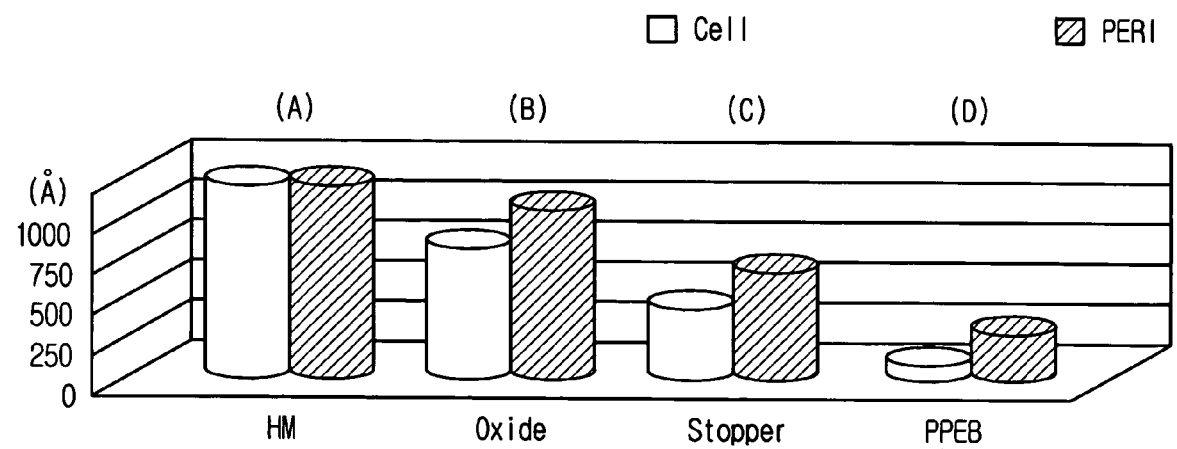
FIG. 12 is a graph showing changes in a thickness of each layer of a substrate structure when a thickness of a hard mask is determined to be approximately 1,150 Å.

FIG. 12 is a graph showing changes in a thickness of each layer of a substrate structure when a thickness of a hard mask is determined to be approximately 1,150 Å.

With reference to FIG. 12, changes in a thickness of the hard mask will be described in detail. Table 4 provided below shows the changes in the thickness of the hard mask in a cell region and in a peripheral region when a series of landing plug contact processes are carried out.

TABLE 4

| Thickness of Hard Mask | Cell Region | Peripheral Region |
| --- | --- | --- |
| (A) Initially formed hard mask (Å) | 1150 | 1150 |
| (B) Remaining hard mask after a SAC etching process (Å) | 750 | 980 |
| (C) Remaining hard mask after a contact opening process (Å) | 400 | 630 |
| (D) Remaining hard mask after a plug formation process (Å) | 0–50 | 230 |

With reference to FIG. 12 and Table 4, at Step (A), the initially formed hard mask has a thickness of approximately 1,150 Å, and at Step (B), a thickness of a damaged portion of the hard mask formed in the cell region is approximately 400 Å, while that of a damaged portion of the hard mask formed in the peripheral region is approximately 170 Å, and thus, thicknesses of the remaining hard mask in the cell region and in the peripheral region are approximately 750 Å and approximately 980 Å, respectively.

At Step (C) of opening a contact region by removing the etch stop layer through the use of a blanket etch-back process, approximately 350 Å of the hard mask in the cell region and in the peripheral region is damaged, thereby obtaining the hard mask of approximately 400 Å remaining in the cell region and the hard mask of approximately 630 Å remaining in the peripheral region.

At step (D) of forming the plug by performing an etch-back process and/or a CMP process, a thickness of the remaining hard mask in the cell region ranges from approximately 0 Å to approximately 50 Å, while the hard mask in the peripheral region remains in a thickness of approximately 230 Å.

Particularly, after the contact region is opened by removing the etch stop layer, the hard mask in the cell region remains with a thickness of approximately 400 Å. Thus, as mentioned above, this remaining hard mask may be lifted during the subsequent wet cleaning process using a cleaning solution of BOE. Therefore, as described in the first embodiment, this problem of the lifting phenomenon can be solved by forming the hard mask on the inter-layer insulation layer that is previously polished until the inter-layer insulation layer is planarized at the same level as the gate hard mask.

Meanwhile, in case of forming the hard mask with a thick thickness as shown in FIGS. 11 and 12, there may be a problem in selectivity of the hard mask with respect to a photoresist pattern. Thus, it is preferable to vary a thickness of the hard mask depending on a design rule of a semiconductor device and types of applied processes.

FIGS. 13A to 13G are cross-sectional views illustrating a method for forming a fine pattern in a semiconductor device with use of an ArF photolithography process in accordance with a second embodiment of the present invention.

Figure 13A:
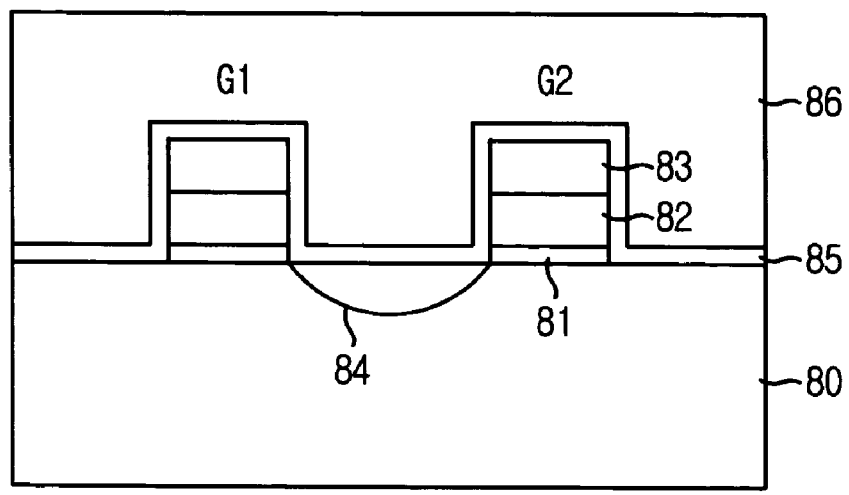
FIGS. 13A to 13G are cross-sectional views illustrating a method for forming a fine pattern in a semiconductor device with use of an ArF photolithography process in accordance with a second embodiment of the present invention.

Referring to FIG. 13A, a plurality of gate structures G1 and G2 are formed on a substrate 80 provided with various device elements. Each of the gate structures G1 and G1 includes a gate hard mask 83, a gate conductive layer 82 and a gate insulation layer 81.

Herein, the gate insulation layer 81 is made of a typical oxide-based material such as silicon oxide, and the gate conductive layer 82 is made of a material such as polysilicon, W, WN, WSi$_x$, or combination thereof. The gate hard mask 83 serves a role in protecting the gate conductive layer 82 in the course of forming a contact hole by etching an inter-layer insulation layer during an etching process for forming a subsequent contact, and thus, the gate hard mask 83 is made of a material providing a highly different etch selectivity from the inter-layer insulation layer. For instance, if the inter-layer insulation layer is made of an oxide-based material, the gate hard mask 83 is made of a nitride-based material such as SiN or SiON. If the inter-layer insulation layer is made of a polymer-based low dielectric material, the gate hard mask 83 is made of an oxide-based material.

An impurity diffusion region 84 such as a source/drain junction is formed in the substrate 80 disposed between the gate structures G1 and G2. In general, if the source/drain junction is formed in the substrate 80 disposed between the gate structures G1 and G2 through performing an ion implantation method, impurities are ion implanted by the ion implantation method proceeding in alignment to the substrate 80. Then, a spacer is formed on sidewalls of each gate structure G1 and G2, and then, an ion implantation method is performed again to make a lightly doped drain (LDD) structure. Herein, detailed description on the steps of forming the LDD structure and the spacer is omitted.

Next, an etch stop layer 85 is formed on the gate structures G1 and G2. Herein, the etch stop layer 85 serves a role in stopping a SAC etching process in order to protect the substrate 80 from being damaged by the SAC etching process. At this time, it is preferable that the etch stop layer 85 is formed along a profile of the gate structures G1 and G2 and is made of a nitride-based material such as silicon nitride or silicon oxynitride.

Next, an inter-layer insulation layer 86 made of an oxide-based material is formed on the etch stop layer 85. Herein, the inter-layer insulation layer 86 is made of a material selected from a group consisting of BPSG, BSG, PSG, TEOS, HDP oxide and spin on glass. It is still possible to use inorganic or organic low dielectric materials for forming the inter-layer insulation layer 86.

Figure 13B:
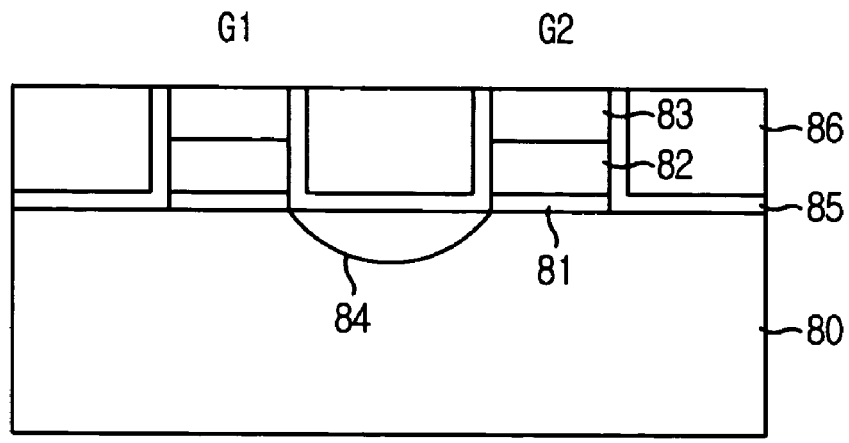

Referring to FIG. 13B, the inter-layer insulation layer 86 and the etch stop layer 85 are removed until the gate hard mask 83 is exposed, so that the inter-layer insulation layer 86 is planarized at the same level of the gate hard mask 83. At this time, the removal of the inter-layer insulation layer 86 proceeds by employing a CMP process. However, the CMP process should be carried out such that a damaged portion of the gate hard mask 83 is less than approximately 100 Å. Also, it is important to choose an appropriate type of slurry for the CMP process that gives uniformity of the gate hard mask 83 and the inter-layer insulation layer 76 after the CMP process.

Figure 13C:
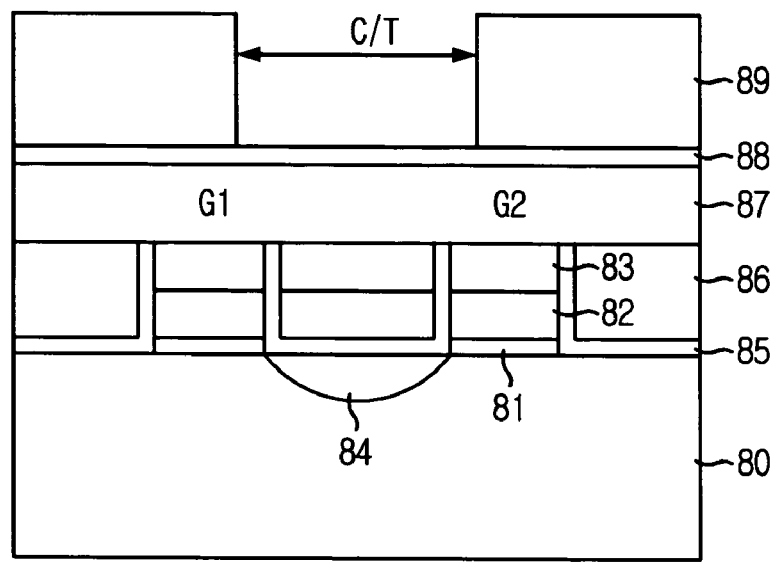

Referring to FIG. 13C, a hard mask layer 87 is formed on the above inter-layer insulation layer 86. Herein, the hard mask layer 87 has an insulating property and an etch selectivity with respect to the inter-layer insulation layer 86. Also, the hard mask layer 87 is preferably formed by using a material selected from a group consisting of nitride-based materials, polysilicon, aluminum oxide ($Al_2O_3$), and tungsten (W). Examples of the nitride-based materials are silicon nitride and silicon oxynitride.

In case of employing one of the nitride-based materials as the hard mask layer 87, plasma-enhanced nitride or low pressure nitride is preferably used. Also, a thickness of the hard mask layer 87 is determined with consideration of a portion of the hard mask layer 87 being damaged when the inter-layer insulation layer 86 is subjected to a SAC etching process and another portion of the hard mask layer 87 being damaged when the impurity diffusion region 84 is exposed by etching the etch stop layer 85. That is, the hard mask layer 87 preferably has a thickness equal to or greater than such a thickness that allows the hard mask layer 87 to be naturally removed in situ during the etching of the etch stop layer 85, or that is greater than this mentioned thickness.

For instance, in a device with a linewidth less than approximately 100 nm fabricated according to the second embodiment of the present invention, a thickness of a damaged portion of the hard mask layer 87 during the SAC etching process is approximately 300 Å, and a thickness of a damaged portion of the hard mask layer 87 during the etching of the etch stop layer 85 is approximately 300 Å. Under consideration of the totally damaged portions of the hard mask layer 87, the thickness of the hard mask layer 87 is determined to range preferably from approximately 400 Å to approximately 800 Å. However, this determined thickness can vary depending on an applied reticle or a device.

After the formation of the hard mask layer 87, an anti-reflective coating layer 88 is formed on the hard mask layer 87. Herein, the anti-reflective coating layer 87 serves a role in preventing formation of undesired patterns, caused by scattering reflection occurring because the hard mask layer 87 has a high index of reflection, during a photo-exposure process for forming a pattern and in improving adhesion between the hard mask layer 87 and a subsequent photoresist pattern. At this time, it is preferable to form the anti-reflective coating layer 88 with an organic-based material having a similar etch characteristic to the photoresist pattern. Also, it is possible to omit the formation of the anti-reflective coating layer 88.

Afterwards, the above mentioned photoresist pattern 89 for forming a landing plug contact is formed by a series of processes. A reference denotation 'C/T' expresses a region in which a contact hole for a landing plug contact will be formed. Although not illustrated, the photoresist pattern 89 is first prepared by forming a photoresist layer for use in an ArF photolithography device on the anti-reflective coating layer 88 through performing a spin coating method. The photoresist layer is selectively photo-exposed by using an ArF photolithography device and a predetermined reticle for defining a width of a contact hole. A developing process is then employed to make photo-exposed portions or non-photo-exposed portions remain, and a cleaning process is subsequently employed to remove etch remnants.

Figure 13D:
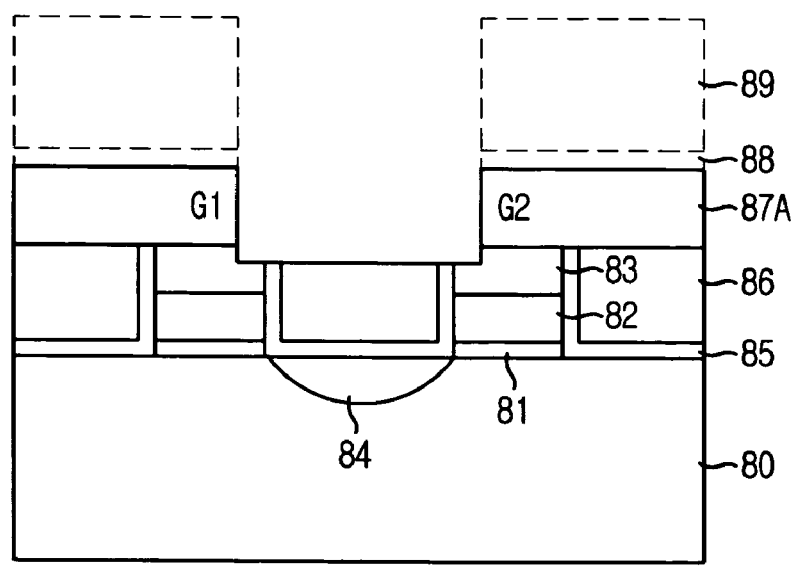

Referring to FIG. 13D, the anti-reflective coating layer 88 and the hard mask layer 87 are etched with use of the photoresist pattern 89 as an etch mask to thereby forming a hard mask 87A.

If an ArF photolithography process is employed, it is difficult to set up a process recipe for forming a line type pattern, i.e., the hard mask 87A in this second embodiment. To obtain such line type pattern, it is necessary to apply a process recipe advantageous in suppressing occurrences of striation and deformation in an intended pattern structure. That is, an electrode temperature is lower, and a plasma source and a bias should be independently controlled. Also, a bias power should be extremely low.

This process recipe makes the anti-reflective coating layer 88 made of an organic material and the hard mask layer 87 etched simultaneously. This simultaneous etching of the anti-reflective coating layer 88 and the hard mask layer 87 is important to realize an intended structure of the hard mask 87A. Also, it is possible to control a CD of the hard mask 87A formed by controlling the use of an etch gas and an etching time. As a result, it is further possible to increase a margin for securing a sufficient CD of a bottom of a contact hole which will be formed by performing a SAC etching process.

Then, the photoresist pattern 89 is removed by employing an ashing process. If the anti-reflective coating layer 88 is made of an organic material, the anti-reflective coating layer 88 is simultaneously removed by the above ashing process. The ashing process can be one of a photoresist stripping process and an oxygen plasma treatment. As described above, the remaining portion of the photoresist pattern 89 may become a factor for forming defective patterns during a subsequent SAC etching process.

Figure 13E:
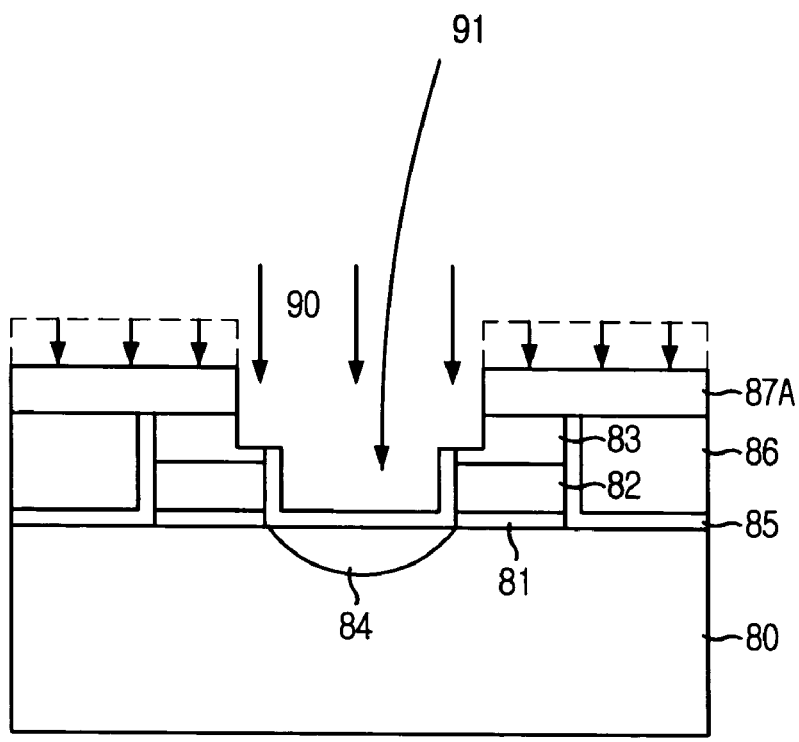

Referring to FIG. 13E, the inter-layer insulation layer 86 is etched by using the hard mask 87A as an etch mask until the etch stop layer 85 disposed between the gate structures G1 and G2 is exposed. This etching process is a SAC etching process denoted with a reference numeral 90. From this SAC etching process 90, a contact hole 91 is formed.

At this time, since the SAC etching process 90 can proceed without considering deformation of the photoresist pattern 89 shown in FIG. 13D, a typical SAC process recipe that maximizes etch selectivity of the inter-layer insulation layer 86 with respect to the hard mask 87A and secures a sufficient CD of the bottom of the contact hole 91. Because supply of a carbon source gas is limited due to the photoresist layer, it is essential to use a gas providing higher selectivity compared with gases typically employed in the SAC etching process. Thus, the use of gases generating lots of $CF_2$ radicals such as $C_4F_6$ and $C_5F_8$ is preferred to such a conventionally used gas of $C_4F_8$.

Also, it is necessary to set the process recipe appropriately in order to secure the CD of the bottom of the contact hole 91 susceptible to the use of such gas providing high selectivity. More specifically, an electrode temperature of approximately 40° C. is used to improve the selectivity, and oxygen is added to secure the CD of the bottom of the contact hole 91.

As shown in FIG. 13D, the hard mask 87A is contacted to the gate hard mask 83 by removing the inter-layer insulation layer 86, and thus, an etch target of the SAC etching process is decreased as much as the removed portion of the inter-layer insulation layer 86. This effect further provides an effect of increasing a process margin. For instance, in the conventional SAC etching process, a thickness of a damaged portion of the gate hard mask ranges from approximately 300 Å to approximately 400 Å. However, in accordance with the second embodiment, because of the decreased thickness of the etch target, the damaged portion of the gate hard mask 83 can be decreased to a thickness ranging from approximately 100 Å to approximately 200 Å, and an etching period is also shortened. In addition, the thickness of the inter-layer insulation layer 86 decreases from approximately 5,000 Å to approximately 3,500 Å. This decreased thickness of the inter-layer insulation layer 86, i.e., approximately 1,500 Å, makes it possible to extend the CD of the bottom of the contact hole 91 by approximately 10%.

Compared with the conventional SAC etching process using the photoresist pattern as an etch mask, because of the pronounced decrease of the gate hard mask 83, the thickness of the damaged portion of the gate hard mask 83 is reduced even with adding approximately 300 Å of the gate hard mask 83. As a result, it is not necessary to protect the gate hard mask 83 by forming a capping layer on the gate structures G1 and G2 with use of undoped silicate glass (USG).

This omission of the formation of the capping layer provides an effect of achieving a simplified process and another effect of preventing an incidence of non-opened contact occurring when the etch stop layer 85 is etched due to the non-uniformly deposited capping layer within the contact hole 91.

Figure 13F:
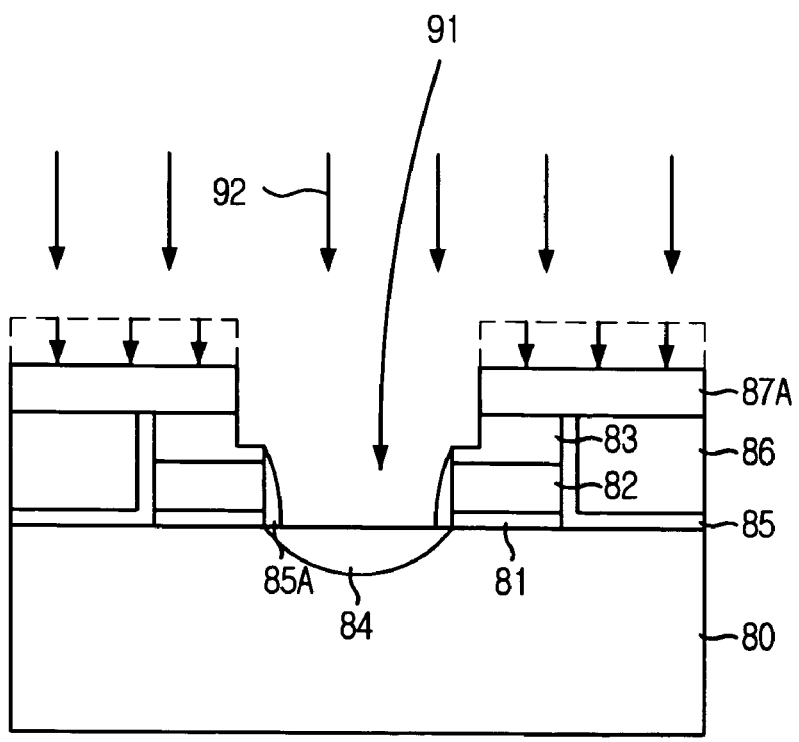

Referring to FIG. 13F, the exposed portion of the etch stop layer 85 is removed, thereby exposing the impurity diffusion region 84. The removal of the etch stop layer 85 proceeds by employing a blanket etch-back process as denoted with a reference numeral 92. At this time, the gate hard mask 83 is damaged with a thickness the same as the removed thickness of the etch stop layer 85, i.e., approximately 300 Å. Thus, the total thickness of the damaged gate hard mask 83 ranges from approximately 400 Å to approximately 500 Å.

As described above, it is preferable to remove the remaining portion of the hard mask 87A in situ as the exposed portion of the etch stop layer 85 is removed. However, it is very difficult to control this removal of the hard mask 87A, and thus, the hard mask 87A still remains on the gate hard mask 83 even after the removal of the etch stop layer 85.

Since the hard mask 87A is made of an insulating material, it is possible to initiate a series of landing plug contact formation processes in situ at the same equipment. For instance, in case of using a two chamber body equipment with a photoresist stripper, the hard mask formation process and a photoresist stripping process can be performed in one chamber, while the SAC etching process and the removal of the etch stop layer can proceed in another chamber. In this case, the substrate 80 provided with the photoresist pattern 89 is preferably loaded into the above two chamber body equipment. This use of the nitride-based material for forming the hard mask 87A solves the problem of performing the etching process forming the hard mask made of polysilicon or tungsten ex situ and thus, shortening a turn around time (TAT).

Figure 13G:
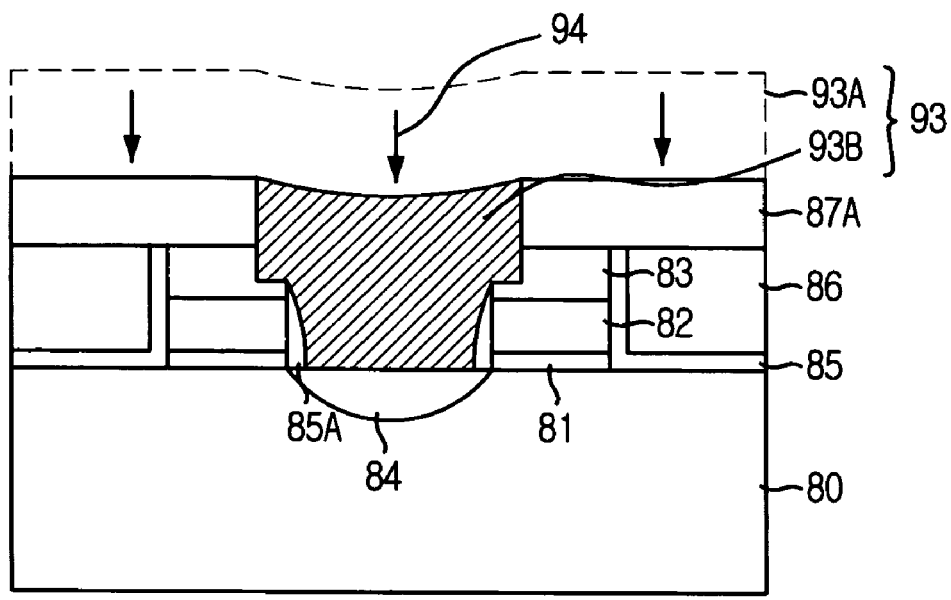
Figure 13H:
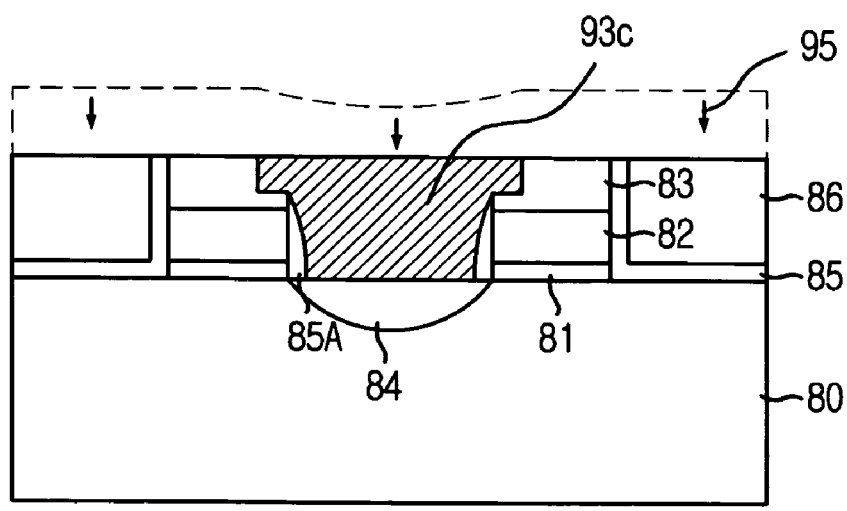

With reference to FIGS. 13G and 13H, a plug formation process will be described in detail hereinafter.

Referring to FIG. 13G, a conductive material 93 for forming a plug is formed on the above resulting substrate structure obtained after the blanket etch-back process so as to be filled in the contact hole 91. Then, a planarization process is performed until the gate hard mask 83 is exposed.

Herein, the conductive material 93 is typically polysilicon, and a barrier metal of Ti and TiN can be used as the conductive material 93 in addition to the use of polysilicon. Also, instead of using polysilicon, tungsten can be used.

Since the hard mask 87A shown in FIG. 13F is made of nitride having an insulation property, it is possible to form a plug made of polysilicon through a deposition method or through a selective epitaxial growth (SEG) method. In more detail of the SEG method, if the hard mask 87A is made of tungsten or polysilicon, the hard mask 87A loses selectivity with respect to the impurity diffusion region 84. Thus, when the SEG method is employed, silicon is grown even on the hard mask 87A. Because of this degraded selectivity, the hard mask 87A must be removed prior to performing the SEG method. However, if the hard mask 87A is made of nitride, it is not necessary to remove the hard mask 87A before the SEG method is preformed. Therefore, it is possible to apply the hard mask 87A regardless of the plug formation process even in a sub 80 nm semiconductor device.

In the conventional method of forming a plug in the absence of a hard mask through a deposition method, there are generated seams in the plug due to dependency on a profile of an inter-layer insulation layer. That is, because of a capping layer and a wet cleaning process, the profile of the inter-layer insulation layer induces seams during the plug formation process. In contrast, in accordance with the second embodiment, the remaining portion of the hard mask 87A provides another effect of improving a profile of the inter-layer insulation layer 86, thereby preventing seam generation in a plug 93C shown in FIG. 13H. Herein, the profile of the inter-layer insulation layer 86 has a slightly inclined etch profile.

In more detail of the planarization of the conductive material 93, a CMP process or an etch-back process can be employed as the planarization process. In case of employing the CMP process, it is highly probable that patterns become defective because of a different etch rate at a center of a wafer and at edges of the wafer. Hence, in the second preferred embodiment, an etch-back process is employed to planarize the conductive material 93. At this time, the etch-back process is carried out at an isotropic etching device and proceeds in two steps.

In more detail of the device for the planarization process, when using a reactive ion etching (RIE) device, a portion of the conductive material 93 disposed on sidewalls of the inter-layer insulation layer 86 cannot be effectively removed, thereby increasing a risk of leakage currents between the plugs 93C. However, in case of employing the isotropic etching device, an intended profile of the plug 93C can be more effectively obtained in an actual application of the planarization process. Herein, a portion of the conductive material 93 disposed on top of the remaining portion of the hard mask 87A and another portion of the conductive material 93 disposed on the sidewalls of the inter-layer insulation layer 86 will be referred to as a first conductive material 93A and a second conductive material 93B, respectively.

For the first step of the etch-back process as denoted with a reference numeral 94 in FIG. 13G, the first conductive material 93A is etched under a condition that an oxide-based or a nitride-based layer, i.e., the hard mask 87A, is etched faster than the first conductive material 93A. After the first step 94, the hard mask 87A becomes exposed.

Referring to FIG. 13H, for the second step of the etch-back process as denoted with a reference numeral 95, a portion of the second conductive material 93B is etched under a condition that the first conductive material 93A is etched faster than an oxide-based or nitride-based layer. Thus, as the second conductive material 93B is etched, the remaining portion of the hard mask 87A and the inter-layer insulation layer 86 are simultaneously etched, thereby obtaining the plug 93C.

The reason for performing the etch-back process is to eliminate a height difference between the plug 93C and the surrounding structure which adversely affect a subsequent contact formation process such as a bit line contact and further to prevent generation of leakage currents between the plugs 93C through sidewalls of the inter-layer insulation layer 86 caused by this height difference.

Figure 14:
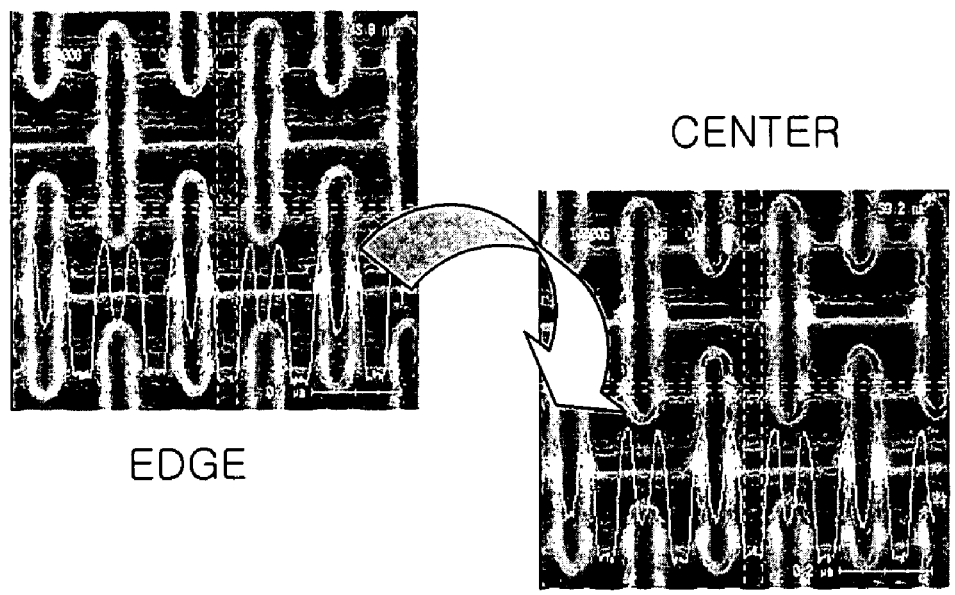
FIG. 14 is a micrograph of scanning electron microscopy (SEM) showing a centre and edges of a wafer obtained in accordance with the present invention.

FIG. 14 is a micrograph of scanning electron microscopy (SEM) showing a centre and edges of a wafer obtained in accordance with the present invention.

As shown, there is barely seen a difference between patterns disposed in central and edge regions of the wafer. Also, a CD of a bottom of a contact is increased by approximately 20%.

Figure 15A:
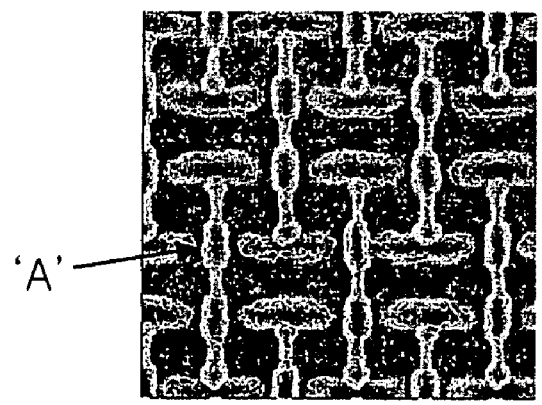
FIG. 15A is a micrograph of SEM showing patterns obtained by using a RIE device.
Figure 15B:
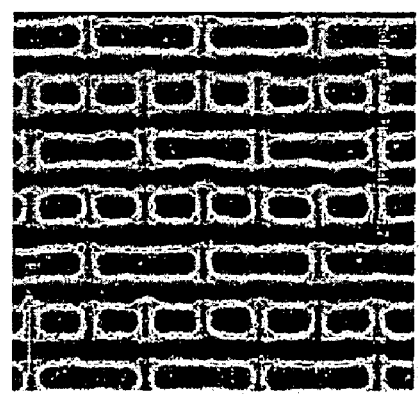
FIG. 15B is a micrograph of SEM showing patterns obtained by using an isotropic etching device for an etch-back process for forming a plug.

FIGS. 15A and 15B are micrographs of SEM showing patterns obtained by using a RIE device and an isotropic etching device for an etch-back process for forming a plug, respectively.

Referring to FIG. 15A, a conductive material for forming a plug disposed on sidewalls of an inter-layer insulation layer is not removed, thereby resulting in an electric short between the plugs. This electric short phenomenon is marked with a reference denotation A. As shown in FIG. 15B, unlike the use of RIE device, there is not generated an electric short between the plugs.

In accordance with the first and the second preferred embodiments of the present invention, it is possible to prevent generation of defective patterns caused by the lifted hard mask usually occurring when the hard mask still remains after the wet cleaning process for opening a contact region.

Although the first and the second preferred embodiments of the present invention exemplify the case of forming the contact hole between the gate structures, it is still possible to open a contact hole between bit line structures, i.e., a storage node contact hole formation process, or for forming a via hole formation process. Also, although the first and the second preferred embodiments exemplify the case of performing the SAC etching process with use of the line type pattern, it is possible to use a hole type pattern for the SAC etching process.

The present application contains subject matter related to the Korean patent application Nos. KR 2003-74718 and KR 2003-94506, filed in the Korean Patent Office on Oct. 23, 2003, and on Dec. 22, 2003, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:

forming a plurality of conductive structures on a substrate provided with a cell region and a peripheral region;

forming an etch stop layer on the conductive structures;

forming an inter-layer insulation layer on the etch stop layer;

planarizing the inter-layer insulation layer and the etch stop layer by removing the inter-layer insulation layer and the etch stop layer until the conductive structures are exposed;

forming a nitride layer for forming a hard mask on the planarized conductive structures and the inter-layer insulation layer;

forming an anti-reflective coating layer on the nitride layer;

forming a photoresist pattern on the anti-reflective coating layer through a photolithography process by using a light source of ArF;

selectively etching the anti-reflective coating layer and the nitride layer with use of the photoresist pattern as an etch mask to thereby form the hard mask;

removing the photoresist pattern and the anti-reflective coating layer;

etching the inter-layer insulation layer disposed between conductive structures with use of the hard mask as an etch mask to thereby form at least one contact hole exposing the etch stop layer;

removing the exposed etch stop layer, thereby exposing a portion of the substrate; and cleaning inside the at least one contact hole.

2. The method of claim 1, wherein the step of planarizing the inter-layer insulation layer and the etch stop layer proceeds by performing a chemical mechanical polishing (CMP) process until a damaged thickness of the conductive structure is equal to or less than approximately 100 Å.

3. The method of claim 1, wherein the inter-layer insulation layer is made of an oxide-based material, and the step of forming the contact hole proceeds by employing a self-aligned contact (SAC) etching process.

4. The method of claim 3, wherein the conductive structure includes a hard mask insulation layer and a conductive layer, and the hard mask insulation layer is formed with a thickness greater than the addition of a damaged thickness of the hard mask insulation layer formed during the SAC etching process and a damaged thickness of the hard mask insulation layer during the removal of the etch layer.

5. The method of claim 3, wherein the SAC etching process proceeds by using one of $C_4F_6$ gas and $C_5F_8$ gas.

6. The method of claim 1, wherein the step of removing the etch stop layer proceeds by employing a blanket etch-back process.

7. The method of claim 6, wherein the nitride layer is formed with a thickness equal to or greater than the addition of a damaged thickness of the contact hole and a damaged thickness of the etch stop layer.

8. The method of claim 1, wherein at the step of removing the etch stop layer, the etch stop layer in the cell region is removed by using a mask opening the cell region.

9. The method of claim 1, after the step of performing the cleaning process, further including the step of forming a plug electrically connected with an exposed portion of the substrate.

10. The method of claim 9, wherein the step of forming the plug includes the steps of:

forming a conductive material to be electrically connected with the exposed portion of the substrate;

etching back the conductive material to reduce a height difference between the cell region and the peripheral region; and polishing the conductive material until the conductive structures are exposed to thereby form the plug.

11. The method of claim 10, wherein the step of forming the conductive material proceeds by employing a deposition method which deposits the conductive material on a resulting structure obtained after the cleaning process.

12. The method of claim 10, wherein the step of forming the conductive material proceeds by employing a selective epitaxial growth (SEG) method which makes the conductive material grow from the exposed substrate.

13. The method of claim 1, wherein the photoresist pattern is formed as a line type.

14. The method of claim 1, wherein the photoresist pattern is formed as a hole type.

15. The method of claim 1, wherein the conductive structure is a gate structure.

16. The method of claim 1, wherein the conductive structure is a bit line structure.

17. The method of claim 1, wherein the conductive structure is a metal wire.

18. The method of claim 1, after the step of forming the photoresist pattern, further including the step of loading a substrate structure provided with the photoresist pattern into an etching device having a first chamber and a second chamber, wherein in the first chamber, the step of forming the hard mask and the step of removing the photoresist pattern and the anti-reflective coating layer proceed, and in the second chamber, the step of forming the contact hole and the step of removing the etch stop layer proceed.

19. A method for fabricating a semiconductor device, comprising the steps of:

forming a plurality of conductive structures on a substrate provided with a cell region and a peripheral region;

forming an etch stop layer on the conductive structures;

forming an inter-layer insulation layer on the etch stop layer;

planarizing the inter-layer insulation layer and the etch stop layer by removing the inter-layer insulation layer and the etch stop layer until the conductive structure is exposed;

forming a nitride layer for forming a hard mask on the planarized conductive structures and the inter-layer insulation layer;

forming an anti-reflective coating layer on the nitride layer;

forming a photoresist pattern on the anti-reflective coating layer through a photolithography process by using a light source of ArF;

selectively etching the anti-reflective coating layer and the nitride layer with use of the photoresist pattern as an etch mask to thereby form a hard mask;

removing the photoresist pattern and the anti-reflective coating layer;

etching the inter-layer insulation layer disposed between conductive structures with use of the hard mask as an etch mask to thereby form a contact hole exposing the etch stop layer;

removing the exposed etch stop layer, thereby exposing the substrate;

cleaning inside the contact hole;

forming a conductive plug layer to be electrically connected with the exposed substrate;

performing a first etch-back process for exposing the hard mask under a condition that the conductive plug layer is etched faster than the hard mask; and performing a second etch-back process for exposing the inter-layer insulation layer under a condition that the hard mask is etched faster than the conductive plug layer, thereby obtaining at least one isolated plug.

20. The method of claim 19, wherein the first etch-back process and the second etch-back process are performed using an isotropic etching device.

21. The method of claim 19, wherein the step of planarizing the inter-layer insulation layer and the etch stop layer proceeds by performing a CMP process until a damaged thickness of the conductive structure is equal to or less than approximately 100 Å.

22. The method of claim 19, wherein the inter-layer insulation layer is made of an oxide-based material, and the step of forming the contact hole proceeds by employing a SAC etching process.

23. The method of claim 22, wherein the conductive structure includes a hard mask insulation layer and a conductive layer, and the hard mask insulation layer is formed with a thickness greater than a damaged thickness of the hard mask insulation layer during the SAC etching process and a damaged thickness of the hard mask insulation layer during the removal of the etch stop layer.

24. The method of claim 21, wherein the SAC etching process proceeds by using one of $C_4F_6$ gas and $C_5F_8$ gas.

25. The method of claim 19, wherein the step of removing the etch stop layer proceeds by employing a blanket etch-back process.

26. The method of claim 25, wherein the nitride layer is formed with a thickness equal to or greater than the addition of a damaged thickness of the contact hole and a damaged thickness of the etch stop layer.

27. The method of claim 19, wherein at the step of removing the etch stop layer, the etch stop layer in the cell region is removed by using a mask opening the cell region.

28. The method of claim 19, wherein the step of forming the conductive plug layer proceeds by employing a deposition method which deposits the conductive plug layer on a resulting structure obtained after the cleaning process.

29. The method of claim 19, wherein the step of forming the conductive plug layer proceeds by employing a selective epitaxial growth (SEG) method which makes the conductive plug layer grow from the exposed substrate.

30. The method of claim 19, wherein the photoresist pattern is formed as a line type.

31. The method of claim 19, wherein the photoresist pattern is formed as a hole type.

32. The method of claim 19, wherein the conductive structure is a gate structure.

33. The method of claim 19, wherein the conductive structure is a bit line structure.

34. The method of claim 19, wherein the conductive structure is a metal wire.

* * * * *